(12) United States Patent
Fukuda

(10) Patent No.: US 7,079,971 B2
(45) Date of Patent: Jul. 18, 2006

(54) FAIL ANALYSIS DEVICE

(75) Inventor: Hiroaki Fukuda, Tokyo (JP)

(73) Assignee: Advantest Corporation, Tokyo (JP)

( * ) Notice: Subject to any disclaimer, the term of this patent is extended or adjusted under 35 U.S.C. 154(b) by 5 days.

(21) Appl. No.: 10/432,807

(22) PCT Filed: Nov. 16, 2001

(86) PCT No.: PCT/JP01/10041

§ 371 (c)(1),
(2), (4) Date: Feb. 2, 2004

(87) PCT Pub. No.: WO02/45092

PCT Pub. Date: Jun. 6, 2002

(65) Prior Publication Data

US 2004/0153274 A1   Aug. 5, 2004

(30) Foreign Application Priority Data

Nov. 28, 2000 (JP) .............................. 2000-361119
Nov. 28, 2000 (JP) .............................. 2000-361120
Nov. 28, 2000 (JP) .............................. 2000-361121

(51) Int. Cl.
*G06F 19/00* (2006.01)
(52) U.S. Cl. ................... 702/117; 365/201; 714/718; 714/719; 324/537; 324/765
(58) Field of Classification Search ........... 702/117, 702/118, 120; 365/201; 714/718, 719; 324/537, 765; 700/121
See application file for complete search history.

(56) References Cited

U.S. PATENT DOCUMENTS

| | | | | |
|---|---|---|---|---|
| 5,355,083 A | * | 10/1994 | George et al. | 324/229 |
| 5,541,510 A | * | 7/1996 | Danielson | 324/233 |
| 5,761,064 A | * | 6/1998 | La et al. | 700/110 |
| 6,016,278 A | * | 1/2000 | Tsutsui et al. | 365/200 |
| 6,128,403 A | * | 10/2000 | Ozaki | 382/145 |
| 6,185,324 B1 | * | 2/2001 | Ishihara et al. | 382/149 |
| 6,185,707 B1 | * | 2/2001 | Smith et al. | 714/724 |
| 6,349,240 B1 | * | 2/2002 | Ogawa et al. | 700/121 |
| 6,360,341 B1 | * | 3/2002 | Yoshinaga | 714/718 |
| 6,363,500 B1 | * | 3/2002 | Hamada | 714/25 |
| 6,404,911 B1 | * | 6/2002 | Ishihara et al. | 382/149 |
| 6,446,021 B1 | * | 9/2002 | Schaeffer | 702/118 |
| 6,499,120 B1 | * | 12/2002 | Sommer | 714/723 |
| 6,532,182 B1 | * | 3/2003 | Ogawa et al. | 365/201 |
| 6,553,329 B1 | * | 4/2003 | Balachandran | 702/118 |
| 6,564,346 B1 | * | 5/2003 | Vollrath et al. | 714/723 |
| 6,611,728 B1 | * | 8/2003 | Morioka et al. | 700/109 |
| 6,625,769 B1 | * | 9/2003 | Huott et al. | 714/733 |
| 6,721,935 B1 | * | 4/2004 | Morinaga | 716/11 |

(Continued)

FOREIGN PATENT DOCUMENTS

JP     10-308099     11/1998

(Continued)

*Primary Examiner*—Patrick J. Assouad
(74) *Attorney, Agent, or Firm*—Dellett & Walters

(57) ABSTRACT

A fail analysis device enabling a simplified operation and a reduced operation time. A reduced data acquiring section (40) reads a reduced logical data, obtained by reducing detailed logical data as a test result, from a CFM (120) in a semiconductor test device (100) and acquires it. A main viewer generating section (80) generates a main viewer window including a list of a test result for each DUT based on the reduced logical data for displaying on a display device (94). The list includes a result image indicating a pass/fail for each DUT and the reduced image of a fail bit map.

25 Claims, 19 Drawing Sheets

U.S. PATENT DOCUMENTS

| | | | |
|---|---|---|---|
| 6,819,788 B1 * | 11/2004 | Ohta | 382/145 |
| 6,823,272 B1 * | 11/2004 | Sutton | 702/58 |
| 6,841,403 B1 * | 1/2005 | Tanaka et al. | 438/14 |
| 6,842,866 B1 * | 1/2005 | Song et al. | 714/37 |
| 6,845,478 B1 * | 1/2005 | Luong | 714/738 |
| 6,871,168 B1 * | 3/2005 | Tanaka et al. | 703/2 |
| 2001/0000460 A1 * | 4/2001 | Ishihara et al. | 382/149 |
| 2001/0006558 A1 * | 7/2001 | Ohta | 382/145 |
| 2001/0018731 A1 * | 8/2001 | Fujii et al. | 711/170 |
| 2001/0026486 A1 * | 10/2001 | Ogawa et al. | 365/201 |
| 2001/0026949 A1 * | 10/2001 | Ogawa et al. | 438/15 |
| 2003/0220759 A1 * | 11/2003 | Katayama | 702/120 |

FOREIGN PATENT DOCUMENTS

JP        11-134897        5/1999

* cited by examiner

FAIL ANALYSIS DEVICE

TECHNICAL FIELD

The present invention relates to a fail analysis device for displaying a measurement result of a fail distribution state of storage cells of a semiconductor memory.

BACKGROUND ART

A semiconductor test device performs reading and writing of data with respect to each storage cell in a semiconductor memory (hereinafter simply referred to as "memory") serving as a device to be tested (DUT), thereby analyzing failure of each storage cell. In general, the semiconductor test device compares data read out from the DUT and predetermined expected value data to perform judgment of pass/fail and stores a result of this judgment in a fail memory. Fail information stored in the fail memory in this way is collected by a fail analysis device constituted by a workstation and the like to investigate contents of the information, whereby various kinds of failure analysis with respect to this DUT is performed.

For example, the fail analysis device can display a fail distribution state of a large capacity DRAM as a physical map or a logical map by using a predetermined memory device evaluation tool. The physical map is a two-dimensional fail bit map using physical addresses X and Y as coordinates and is used for confirming a physical arrangement of failure storage cells of a memory. In addition, the logical map is a three-dimensional fail bit map using logical addresses X and Y and an I/O number as coordinates and may be four-dimensional in the case in which a logical address Z is used. This logical map is generated based upon fail information to be read out from the above-described fail memory.

Incidentally, a general semiconductor test device is capable of performing tests for a plurality of memories simultaneously, thereby realizing reduction of a test time for one memory. Therefore, when one test ends, fail information corresponding to each of the plurality of memories is stored in the above-described fail memory.

However, if a user attempts to cause the conventional fail analysis device to display contents of the logical map or the physical map in order to analyze the fail information obtained in this way, the user needs to specify a DUT in the first place. Therefore, in the case in which the user desires to know an outline of the fail information for the plurality of DUT which was objects of the test, the user needs to, after designating one DUT, repeat an operation for displaying contents thereof for each DUT. Thus, there is a problem in that complicated operations are necessary, operability is poor, and long time is required for the operations.

In particular, in the case in which the user displays contents of the logical map, the user needs to specify an I/O number together with a DUT. Therefore, in the case in which the user desires to look at an outline of fail information for one DUT, the user needs to, after designating one I/O number, repeat an operation for displaying contents thereof for each I/O number. Thus, operations become more complicated and long time is required for the operations.

In addition, since the user can only display contents of the physical map or the logical map by designating a DUT and the I/O number in the conventional fail analysis device as described above, when the user attempts to compare fail information of the respective DUTs for which the test was performed simultaneously or compare fail information of each I/O number of one DUT, the user needs to remember contents of each physical map or each logical map to be an object of comparison or to print the contents in a paper or the like. Thus, there is a problem in that it is not easy to grasp an outline of fail information for a plurality of DUTs or grasp an outline of fail information for a plurality of I/O numbers of each DUT.

In addition, in the above-described conventional fail analysis device, a detailed logical map or physical map is displayed by performing physical conversion processing based upon fail information read out from the fail memory in the semiconductor test device or using this fail information. Thus, in the case in which the user moves or enlarges a range of a logical map or a physical map to be an object of display, the user needs to read out the fail information from the fail memory in the semiconductor test device again. Therefore, there is a problem in that long time is required since the user instructs change of a display range until the display range is actually changed.

In addition, in the conventional fail analysis device, there is a problem in that an operation for instructing change of a display range is not easy and operability is poor. For example, in the case in which a reduced display screen containing a fail bit map corresponding to the entire DUT and a detailed display screen containing a detailed fail bit map corresponding to a part of the DUT can be selectively switched to be displayed, after confirming a detailed fail bit map of which part the user desires to look at with the reduced display screen, the user switches to a screen of this detailed fail bit map. In this case, if the user attempts to look at detailed fail bit maps of the other parts, the user needs to switch to the reduced display screen again. An operation becomes complicated because the user needs to switch the screens many times. In addition, although it is possible to display a detailed fail bit map of a part, which the user desires to look at, by scrolling displayed contents of the detailed display screen, the contents is not confirmed by alternately displaying the reduced display screen and the detailed display screen. Thus, it is not easy to find a fail part, which the user desires to look at next, by the scroll operation, and the scroll operation is repeated carelessly to some extent.

In addition, it is convenient if the logical map or the physical map generated by the above-described conventional fail analysis device can be superimposed with each other in the case in which tendencies of fail are compared, or the like. In the conventional fail analysis device, such superimposition of a plurality of bit maps is impossible, or it is possible only to perform simple superimposition under limitation. For example, even in the case in which superimposition of two fail bit maps is possible, these two fail bit maps are not associated with each other. Thus, if the user desires to perform superimposition by changing a display magnification again, the user needs to change the display magnification for each of the two fail bit maps. In addition, in the case in which the user desires to move a display area of the fail bit maps, since the two fail bit maps do not move in association with each other, the user needs to move the display area for each of the two fail bit maps. In addition, in the case in which the user performs superimposition by changing a combination of the plurality of fail bit maps, operations are repeated from reading of data for all the fail bit maps to be objects of superimposition every time the combination is changed. In addition, in the case in which the plurality of fail bit maps are superimposed, since only an order of superimposing them cannot be changed, a fail bit map is redrawn by changing the order. In this way, in the case in which superimposition of fail bit maps is performed using the conventional fail analysis device, there is a problem in that operations in performing some kind of change become complicated.

Further, in the case in which, for example, when two fail bit maps are compared, the user confirms to which degree fail parts coincide with each other, the user needs to perform an arithmetic operation of superimposed fail bit maps. However, in the conventional fail analysis device, it is impossible to perform such an arithmetic operation of fail bit maps.

DISCLOSURE OF THE INVENTION

The present invention has been devised in view of such point, and it is an object of the present invention to provide a fail analysis device enabling a simplified operation and a reduced operation time. In addition, it is another object of the present invention to provide a fail analysis device with which an outline of fail information is grasped easily. Further, it is another object of the present invention to provide a fail analysis device which can perform an arithmetic operation using a superimposed plurality of fail bit maps.

The fail analysis device of the present invention is a device for displaying results of testing a plurality of semiconductor memories with a semiconductor test device, and is provided with a test result acquiring unit for acquiring test results corresponding to the plurality of semiconductor memories, a list image generation unit for generating a list image in which the test results corresponding to the plurality of semiconductor memories, which are acquired by this test result acquiring unit, are included in one screen, and a display unit for displaying the list image generated by this list image generation unit. Since the test results corresponding to the plurality of semiconductor memories are displayed in one screen, it becomes easy to grasp an outline of fail information for each semiconductor memory.

More specifically, it is desirable that a result image, which indicates pass/fail for each of the plurality of semiconductor memories, is included as the test result in the above-described list image. Alternatively, it is desirable that a reduced image of a fail bit map is included as the test result for each of the plurality of semiconductor memories in the above-described list image. Since a user can learn whether or not a fail part is included in each semiconductor memory or can learn a general state of a fail distribution of each semiconductor memory by looking at the result image, the user can surely grasp an outline of fail information for the entire plurality of semiconductor memories.

In addition, the fail analysis device of the present invention is a device for displaying a result of testing a semiconductor memory with a semiconductor test device, and is provided with a test result acquiring unit for acquiring a test result corresponding to the semiconductor memory, a list image generation unit for generating a list image in which a test result for each I/O number of the semiconductor memory, which is acquired by this test result acquiring unit, is included in one screen, and a display unit for displaying the list image generated by the list image generation unit. Since the test result corresponding to a plurality of I/O numbers included in the semiconductor memory is displayed on one screen, it becomes easy to grasp an outline of fail information corresponding to each I/O number.

More specifically, it is desirable that a result image indicating pass/fail is included for each I/O number in the above-described list image as the test result. Alternatively, it is desirable that a reduced image of a fail bit map is included for each I/O number in the above-described list image as the test result. Since a user can learn whether or not a fail part is included in a fail bit map corresponding to each I/O number or can learn general contents of the fail bit map corresponding to each I/O number when the user looks at the list image, the user can surely grasp an outline of fail information for the entire plurality of I/O numbers of the semiconductor memory.

In addition, it is desirable that the fail analysis device is further provided with an operation unit for designating any position in the list image displayed on the above-described display unit and a detailed image generation unit for, when any result image is designated by this operation unit, generating a detailed image of a fail bit map corresponding to the result image. It is possible that detailed contents corresponding to the result image can be displayed simply by designating any of result images included in the list image. Therefore, troublesome labors, which are required until contents of a detailed fail bit map corresponding to a semiconductor memory including the fail part or an I/O number are confirmed, are reduced, and simplification of operations becomes possible. In addition, following the simplification of operations, reduction of an operation time also becomes possible.

In addition, it is desirable that the fail analysis device is further provided with an operation unit for designating any position in the list image displayed on the above-described display unit and a detailed image generation unit for, when any reduced image is designated by this operation unit, generating a detailed image of a fail bit map corresponding to the reduced image. It is possible that detailed contents corresponding to the reduced image can be displayed simply by designating any of a plurality of reduced images included in the list image. Consequently, in the case in which a user would like to confirm the detailed contents after he/she look over the reduced display, troublesome labors, which are required until contents of a detailed fail bit map corresponding to a semiconductor memory or an I/O number are confirmed, are reduced, and simplification of operations becomes possible. In addition, following the simplification of operations, reduction of an operation time also becomes possible.

In addition, it is desirable that a reduced fail bit map data necessary for displaying the reduced image is generated by the above-described semiconductor test device and generation of the reduced image is performed by the list image generation unit based upon this reduced fail bit map data. Since the reduced fail bit map data is generated by the semiconductor test device, the fail analysis device can read this generated reduced fail bit map data to generate the reduced image. Therefore, compared with the case in which a detailed fail bit map data is read by the fail analysis device and subjected to predetermined reduction processing to generate a reduced image, time required for reading of data necessary for generation of a list image can be reduced, and reduction of time until the list image is displayed becomes possible.

In addition, in the case in which a result of testing a semiconductor memory with a semiconductor test device is displayed, the fail analysis device of the present invention is provided with a test result acquiring unit for acquiring a test result of the semiconductor memory enabling generation of a fail bit map of a first range, a fail bit map generation unit for generating an image of a fail bit map of a second range narrower than the first range using a part of the test result acquired by the test result acquiring unit, a display unit for displaying the image generated by the fail bit map generation unit, an operation unit for instructing a display range of the fail bit map, and a display range changing unit for changing the display range using the test result acquired by the test result acquiring unit when change of the display range is instructed within the first range by the operation unit. Since the range for acquiring the test result is set to the first range wider than the second range which is a display range, the user does not need to acquire the test result again when this display range is changed within the first range. Therefore, time required since the change of the display range is instructed until the display range is actually changed can be reduced.

In addition, it is desirable that the fail analysis device is provided with an acquisition range setting unit for variably setting a size of the first range according to a size of the display range instructed by the above-described operation unit If the display range is large, the acquisition range of a test result is set large and, to the contrary, if the display range is small, the acquisition range of a test result is set small. Thus, waste of acquiring a test result even for a range almost unnecessary for display can be cut down, and a display operation taking into account processing capability and the like becomes possible.

In addition, it is desirable that the above-described test result acquiring unit performs reacquisition of the test result of the semiconductor memory when change of the display range exceeding the first range is instructed by the operation unit. Consequently, the number of times of acquiring the test result can be minimized.

Further, in the case in which a result of testing a semiconductor memory with a semiconductor test device is displayed, the fail analysis device of the present invention is provided with a test result acquiring unit for acquiring a test result of the semiconductor memory, a fail bit map generation unit for generating a first image of a fail bit map and a second image which is a reduced image of predetermined range including the vicinity of this first image using the test result acquired by the test result acquiring unit, a display unit for displaying the first image and the second image in one screen, an operation unit for instructing change of a display range of a fail bit map corresponding to the first image using the second image, and a display range changing unit for changing displayed contents of the first image when change of the display range is instructed by the operation unit. Since a reduced image (second image) and a detailed image (first image) are included in an identical screen and change of the display range can be instructed using this reduced image, a user does not need to switch to a detailed display screen after roughly confirming contents on a reduced display screen as in the past, and operability in giving an instruction of switching can be improved.

Moreover, it is desirable that the above-described operation unit is a pointing device capable of designating an arbitrary position of the display screen, and by designating two points in the second image with this pointing device, a rectangular area with these two points as opposite angles is designated as a display range after it has been changed. Alternatively, it is desirable that the above-described operation unit is a pointing device capable of designating an arbitrary position on the display screen, and after one point in the second image is designated with this pointing device, by designating a moving direction and a moving amount thereof, move of the display range is instructed. Since a user can perform designation of a new display range by designating two points in the second image larger than the display range of the detailed fail bit map, designation of a range of zoom-in or zoom-out can be performed simply and with the same operation procedures. In addition, by designating one point in the second image and a moving direction and a moving amount thereof, since the user can perform designation of a new display range, an instruction to move the display range can be given easily.

In addition, it is desirable that an acquisition frame indicating a range of the test result acquired by the test result acquiring unit and a display frame indicating a drawing range of the first image are included in the above-described second image. Since a user can perform designation of change of the display range while confirming an actual display range, it becomes easy to judge which part is made a display range next, and a desired part can be displayed with a fewer number of operation times. In addition, since the user can perform designation of change of the display range while confirming an acquisition range of the test result, it becomes possible to instruct change of the display range within the acquisition range of the test result.

In addition, it is desirable that the above-described test result acquiring unit performs reacquisition of the test result of the semiconductor memory when change of the display range exceeding the acquisition frame is instructed by the operation unit. In the case in which the display range is changed within the range of the acquisition range, since a user does not need to perform reacquisition of the test result, the number of times of reacquisition of the test result can be reduced, and time required for changing the display range can be reduced.

In addition, in the case in which a result of testing a semiconductor memory with a semiconductor test device is displayed, the fail analysis device of the present invention is provided with a fail bit map generation unit for generating a plurality of fail bit map images representing a test result corresponding to the semiconductor memory, a layer control unit for assigning each of the plurality of fail bit map images to a plurality of layers and defining relationship among the respective layers, an image superimposing unit for performing processing for superimposing the plurality of fail bit map images defined the relationship among the plurality of layers by the layer control unit, and a display unit for displaying the images superimposed by the image superimposing unit. Since each of the superimposed plurality of fail bit map images corresponds to the plurality of layers and the relationship among the respective layers is defined, in the case in which change of contents of the display image is performed, for example, in the case in which a display magnification is changed or a display range is moved, a user can change displayed contents while keeping a mutual relation of the respective fail bit map image. Consequently, the user does not need to give an instruction to move the respective fail bit map image individually or give an instruction to change a display magnification, and operations can be simplified significantly.

In addition, it is desirable that the above-described layer control unit controls a display/non-display state of a fail bit map image for each layer. Consequently, when display of each of the superimposed fail bit map is turned off or the fail bit map is re-displayed, it becomes unnecessary to repeat reading of data or drawing processing each time, and simplification of processing and operations becomes possible.

In addition, it is desirable that the above-described layer control unit sets contents of a logical operation targeting each of the plurality of layers according to the relation. Since contents of the logical operation are set when the relationship among the respective layers is defined, a logical operation targeting each fail bit map becomes possible in accordance with the set contents.

In addition, it is desirable that the fail analysis device is further provided with an operation unit for instructing change of a display range of the above-described fail bit map and a display range changing unit for, when change of the display range is instructed by this operation unit, executing change of the display range targeting the plurality of fail bit maps corresponding to the plurality of layers assigned by the layer control unit. Consequently, by giving an instruction of change once by the operation unit, a user can change display ranges of a plurality of fail bit maps simultaneously.

Further, it is desirable that the above-described layer control unit defines the relationship by assigning images including images not relating to the test result other than the plurality of fail bit map images to each of the plurality of layers. For example, in the case in which images such as a predetermined frame, ruled lines, letters, or the like are considered, legibility or the like of displayed contents can be improved by further adding this image to the superimposed plurality of fail bit map images.

BEST MODE FOR CARRYING OUT THE INVENTION

A fail analysis device of an embodiment to which the present invention is applied will be hereinafter described with reference to the accompanying drawings.

Figure 1:
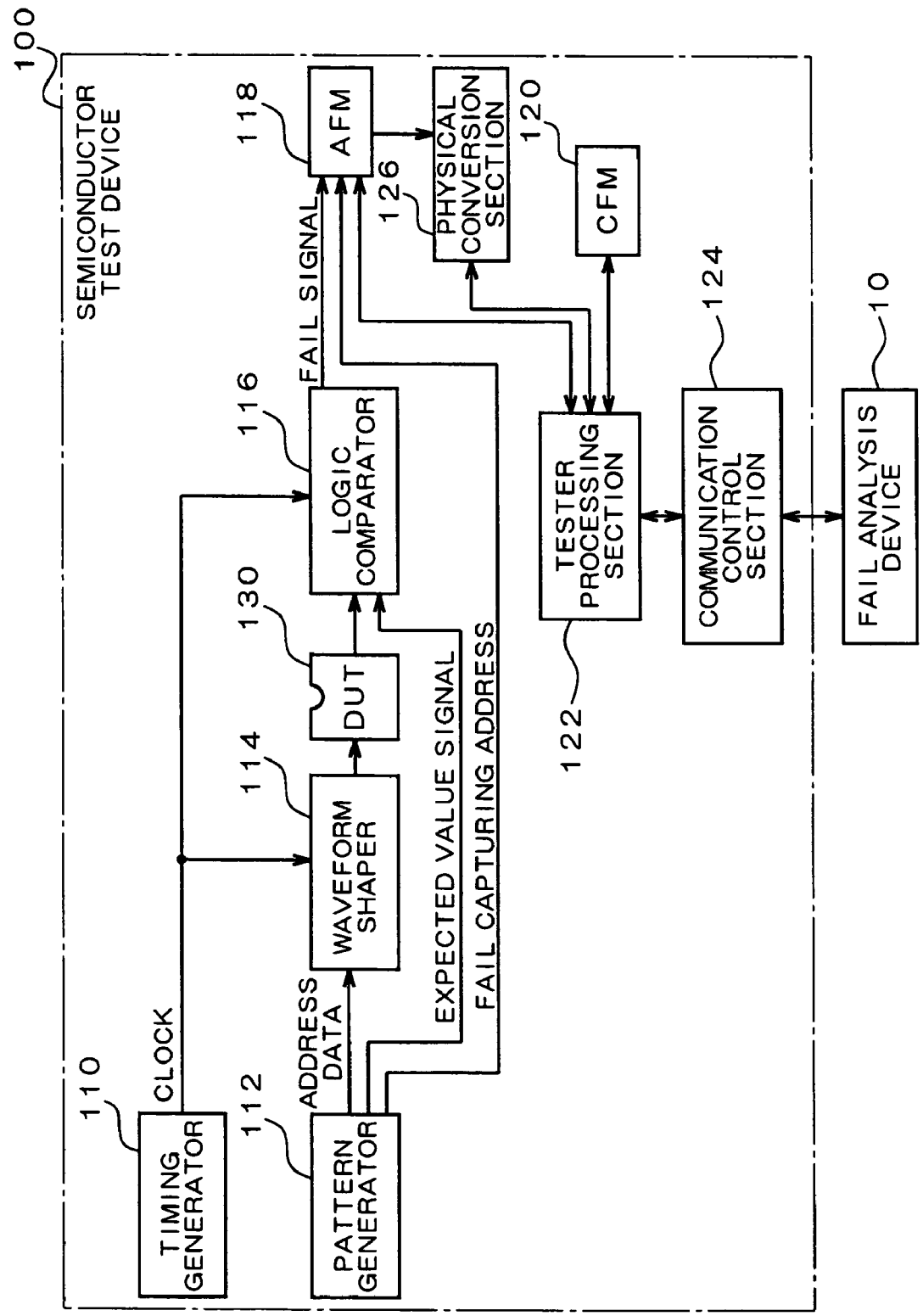
FIG. 1 is a diagram showing a structure of a semiconductor test device to which a fail analysis device of an embodiment is connected.

FIG. 1 is a diagram showing a structure of a semiconductor test device to which a fail analysis device of this embodiment is connected. As shown in FIG. 1, a semiconductor test device 100 includes a timing generator 110, a pattern generator 112, a waveform shaper 114, a logic comparator 116, an AFM (address fail memory) 118, a CFM (compact fail memory) 120, a tester processing section 122, a communication control section 124, and a physical conversion section 126.

An address and data generated by the pattern generator 112 is waveformshaped by the waveform shaper 114 and inputted to the DUT 130. The logic comparator 116 compares data read out from the DUT 130 and an expected value to be outputted from the pattern generator 112 to perform judgment of pass/fail.

The AFM 118 stores fail information for each address according to a fail signal to be outputted by the logic comparator 116 and an address signal to be outputted by the pattern generator 112. All of these series of operations are performed synchronous with a system clock to be inputted in each section from the timing generator 110. The fail information to be stored in this AFM 118 is logic fail bit map data, and bit data indicating pass/fail for each storage cell specified by an X address and a Y address for each I/O number (e.g., pass corresponds to "0" and fail corresponds to "1") is stored.

In addition, the CFM 120 stores fail information which is reduced content of the AFM 118. For example, for each I/O number, the X address is divided into n and the Y address is divided into m, and one bit data corresponding to each divided area is obtained. More specifically, a value of this one bit data is found by calculating OR of a plurality of bit data of the AFM 118 corresponding to the divided areas of the X address and the divided areas of the Y address. That is, in the case in which at least one "1" indicating fail is included in the plurality of bit data specified by each divided area, corresponding bit data in the CFM 120 is set to "1" indicating fail. In the case in which all the plurality of bit data specified by each divided area is "0" indicating pass, corresponding bit data in the CFM 120 is set to "0" indicating pass. Note that, in the following description, data read out from the AFM 118 is referred to as "AFM data" or "detailed logical data" and data read out from the CFM 120 is referred to as "CFM data" or "reduced logical data" for the description.

The physical conversion section 126 performs physical conversion processing based upon the detailed logical data stored in the AFM 118, thereby generating physical fail bit map data (hereinafter referred to as "detailed physical data"). This physical conversion section 126 is constituted by dedicated hardware and can execute the physical conversion processing at high speed.

In addition, the tester processing section 122 controls the entire semiconductor test device 100 in order to execute a test program with an operating system (OS) to carry out a predetermined test. For example, processing for generating CFM data based upon AFM data is performed by this tester processing section 122. The communication control section 124 performs transmission and reception of various data with the fail analysis device 10 connected to the semiconductor test device 100.

Figure 2:
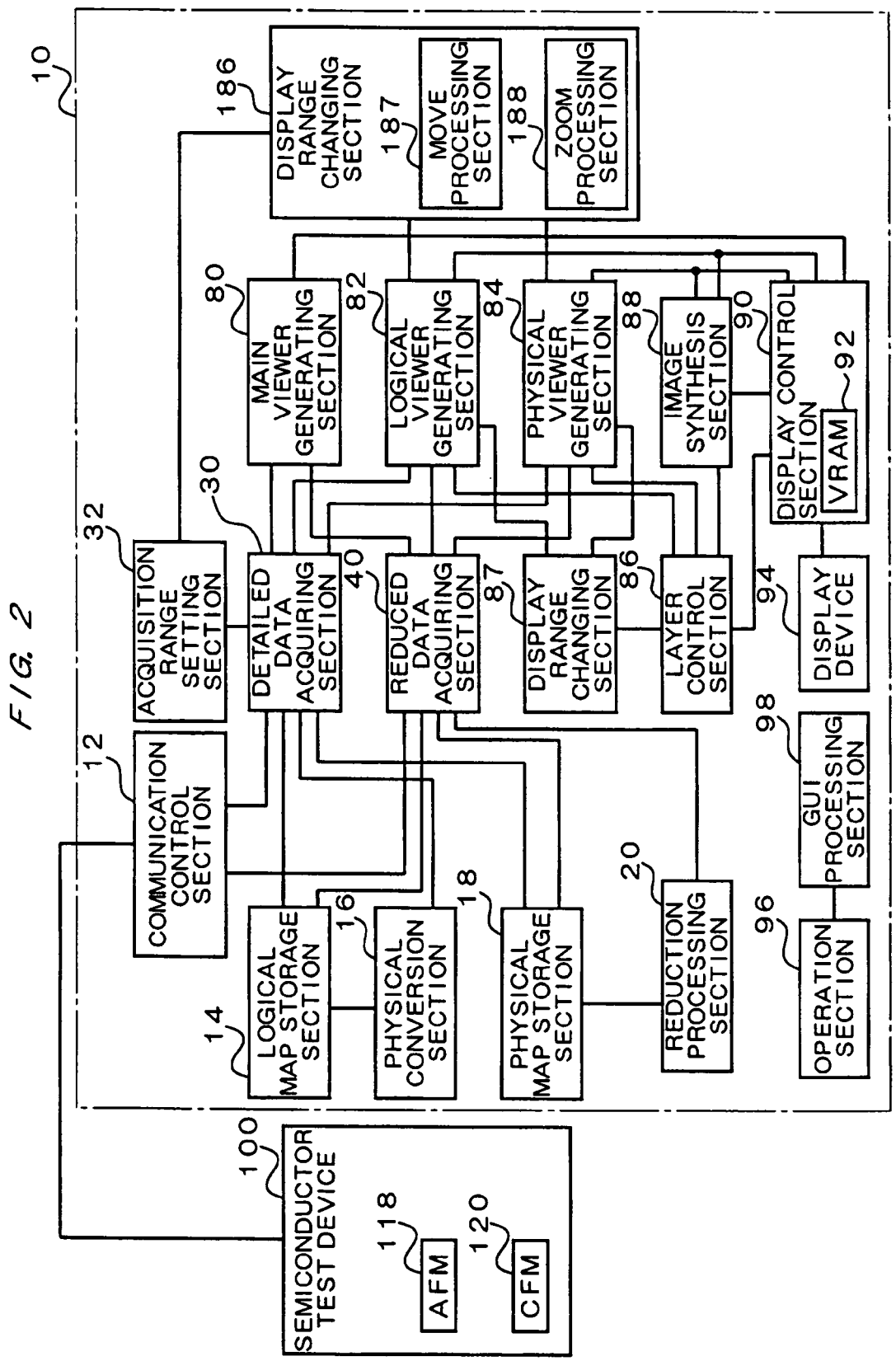
FIG. 2 is a diagram showing a detailed structure of the fail analysis device of this embodiment.

FIG. 2 is a diagram showing a detailed structure of the fail analysis device 10 of this embodiment. As shown in FIG. 2, the fail analysis device 10 includes a communication control section 12, a logical map storage section 14, a physical conversion section 16, a physical map storage section 18, a reduction processing section 20, a detailed data acquiring section 30, an acquisition range setting section 32, a reduced data acquiring section 40, a main viewer generating section 80, a logical viewer generating section 82, a physical viewer generating section 84, a layer control section 86, a display range changing sections 87, 186, an image synthesis section 88, a display control section 90, a display device 94, an operation section 96, and a GUI processing section 98.

The communication control section 12 performs transmission and reception of various data with the semiconductor test device 100. The logical map storage section 14 stores detailed logical data and reduced logical data obtained by a test with respect to the DUT 130.

The physical conversion section 16 generates physical fail bit map data (hereinafter referred to as "detailed physical data") by performing the physical conversion processing based upon the detailed logical data. The physical map storage section 18 stores the detailed physical data obtained by the physical conversion processing by the physical conversion section 16. The reduction processing section 20 performs reduction processing for generating bit map data obtained by reducing contents of the detailed physical data (hereinafter referred to as "reduced physical data"). This reduction processing is the same as the processing in the case in which CFM data is generated from AFM data in the above-described semiconductor test device 100.

The detailed data acquiring section 30 acquires detailed logical data and detailed physical data. The fail analysis device 10 of this embodiment has two kinds of analysis modes of a "tester mode" for performing various kinds of analysis while acquiring the detailed logical data and the reduced logical data directly from the semiconductor test device 100 and a "file mode" for performing various kinds of analysis based upon the detailed logical data or the like saved.

More specifically, the detailed logical data is acquired by reading out the AFM data from the AFM 118 in the semiconductor test device 100 in the tester mode and is acquired by reading out applicable data from the logical map storage section 14 in the file mode. In the tester mode, the detailed physical data is acquired by reading a result of performing the physical conversion processing by the physical conversion section 126 based upon the detailed logical data stored in the AFM 118 in the semiconductor test device 100. In the file mode, the detailed physical data is acquired by reading out applicable data from the physical map storage section 18.

The acquisition range setting section 32 sets acquisition ranges of the detailed logical data and the detailed physical data. In the fail analysis device 10 of this embodiment, separately from a display range of the detailed logical map or physical map, acquisition ranges (reading ranges) of the detailed logical data and the detailed physical data larger than this display range can be set. A specific setting method will be described later.

In addition, the reduced data acquiring section 40 acquires reduced logical data and reduced physical data. More specifically, in the tester mode, the reduced logical data is acquired by reading out CFM data from the CFM 120 in the semiconductor test device 100 and in the file mode, the reduced logical data is obtained by reading out applicable data from the logical map storage section 14. In addition, the reduced physical data is acquired by performing reduction processing by the reduction processing section 20 based upon the detailed physical data acquired by the physical conversion processing in the tester mode, and in the file mode, the reduced physical data is acquired by performing reduction processing by the reduction processing section 20 based upon the detailed physical data read out from the physical map storage section 18.

The main viewer generating section 80 generates drawing data necessary for displaying a main viewer window on the display device 94. Test results of the plurality of DUTs 130 which were objects of test are included in this main viewer window in a list form.

The logical viewer generating section 82 generates drawing data necessary for displaying a logical viewer window on the display device 94. A logical fail bit map at the time when a specific DUT 130 and I/O number are designated is included in this logical viewer window.

In addition, the physical viewer generating section 84 generates drawing data necessary for displaying a physical viewer window on the display device 94. A physical fail bit map at the time when the specific DUT 130 is designated is included in this physical viewer window. Specific examples of the above-described main viewer window, logical viewer window, and physical viewer window will be described later.

Incidentally, in the fail analysis device 10 of this embodiment, a plurality of logical maps or a plurality of physical maps can be superimposed with each other and displayed, and a concept of layer for performing such superimposition of images is introduced. More specifically, each of fail bit map images to be object of superimposition is assigned with each of a plurality of layers to define relationship among the layers.

The layer control section 86 controls contents of setting for each layer and contents of relation among the respective layers. Setting of these pieces of information is performed using a layer window displayed by the layer control section 86. A specific example of the layer window will be described later.

When change of a display range such as move or zoom is instructed, the display range changing section 87 performs change of a display range of superimposed all fail bit maps which are objects of display based upon control information set by the layer control section 86. More specifically, the display range changing section 87 recognizes the fail bit maps, which are superimposed at the point when the instruction of change is given, based upon the control information and, at the same time, instructs the logical viewer generating section 82 or the physical viewer generating section 84 to perform change of the display range of these fail bit maps.

The image synthesis section 88 generates drawing data, which are necessary for displaying an image obtained by superimposing logical maps or physical maps with each other, based upon the control information set by the layer control section 86.

When change of a display range is instructed, the display range changing section 186 performs change of a display range of a fail bit map displayed at that point. This display range changing section 186 is provided with a move processing section 187 and a zoom processing section 188.

When move of a display range is instructed, the move processing section 187 moves a display range in accordance with this instruction of move. More specifically, the move processing section 187 determines a moving direction and a moving amount of the display range and instructs the logical viewer generating section 82 or the physical viewer generating section 84, which correspond to a window displayed at that point, to generate a window including a moved and new logical map or physical map.

When zoom of a display range is instructed, the zoom processing section 188 enlarges (zooms out) or reduces (zooms in) the display range in accordance with this zoom instruction. More specifically, the zoom processing section 188 determines a new display range and instructs the logical viewer generating section 82 or the physical viewer generating section 84, which corresponds to a window displayed at that point, to generate a window including a new logical map or physical map included in this range.

The display control section 90 generates a video signal, which is outputted to the display device 94, based upon drawing data generated by each of the main viewer generating section 80, the logical viewer generating section 82, the physical viewer generating section 84, and the image synthesis section 88. This display control section 90 is provided with a VRAM (video RAM) 92, in which drawing data of a window which a user wishes to display at the top on a screen.

The operation section 96 is for a user to perform various inputs of instructions, and a mouse serving as a pointing device for designating an arbitrary position on a display screen of the display device 94 and a keyboard consisting of ten keys, alphabet keys, or various symbol keys are included in the operation section 96. As the pointing device, a device other than the mouse, for example, an input tablet, a touch panel, or the like may be used. The GUI (Graphical User Interface) processing section 98 is a section for realizing GUI processing corresponding to an operation state of the operation section 96. For example, when various commands and buttons included in a main viewer window or the like are clicked using the mouse, the GUI processing section 98 judges what processing is specified and requests execution of corresponding processing.

In a specific example 1 of operations described below, the detailed data acquiring section 30 and the reduced data acquiring section 40 correspond to a test result acquiring unit, the main viewer generating section 80 corresponds to a list image generation unit, the operation section 96 and the GUI processing section 98 correspond to an operation unit, the logical viewer generating section 82 and the physical viewer generating section 84 correspond to a detailed image generation unit, and the display control section 90 and the display device 94 correspond to a display unit.

In addition, in a specific example 2 of operations, the detailed data acquiring section 30 corresponds to a test result acquiring unit, the acquisition range setting section 32 corresponds to an acquisition range setting unit, the logical viewer generating section 82 and the physical viewer generating section 84 correspond to a fail bit map generating unit, the display control section 90 and the display device 94 correspond to a display unit, the operation section 96 and the GUI processing section 98 correspond to an operation unit, and the display range changing section 186 corresponds to a display range changing unit.

In addition, in a specific example 3 of operations, the main viewer generating section 80, the logical viewer generating section 82, and the physical viewer generating section 84 correspond to a fail bit map generating unit, the layer control section 86 corresponds to a layer control unit, the display range changing section 87 corresponds to a display range changing unit, the image synthesis section 88 corresponds to an image superimposing unit, the display control section 90 and the display section 94 correspond to a display unit, and the operation device 96 and the GUI processing section 98 correspond to an operation unit.

The fail analysis device 10 of this embodiment has such a structure, and operations thereof will be described next.

SPECIFIC EXAMPLE 1 OF OPERATIONS

Figure 3:
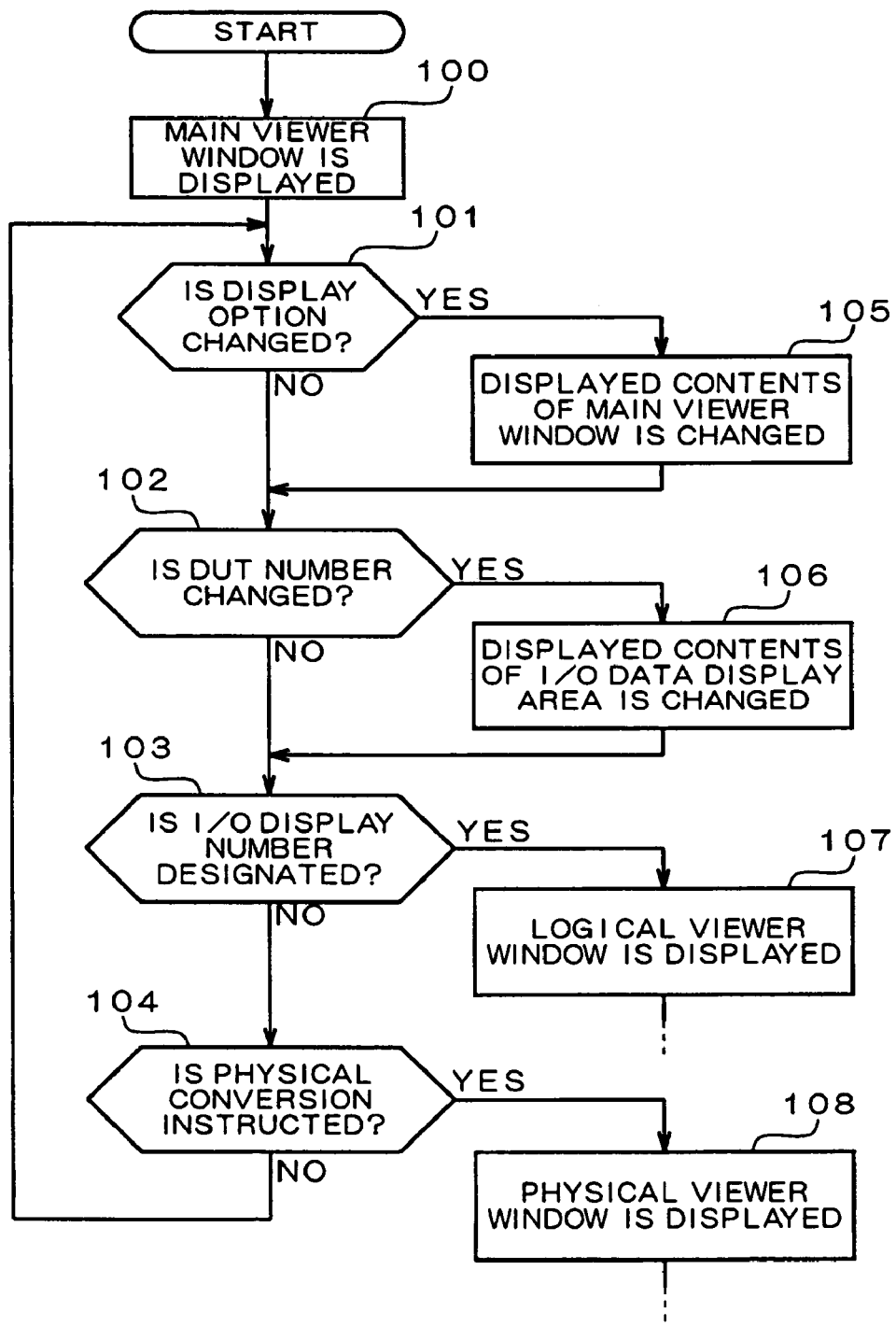
FIG. 3 is a flow diagram showing operation procedures of a fail analysis device corresponding to a specific example 1.

FIG. 3 is a flow diagram showing operation procedures of a fail analysis device corresponding to a specific example 1 and shows a series of operation procedures for displaying a main viewer window in the tester mode.

When the fail analysis device 10 is started up, first, the main viewer generating section 80 generates a screen of the main viewer window and displays it on the display device 94 (step 100).

Figure 4:
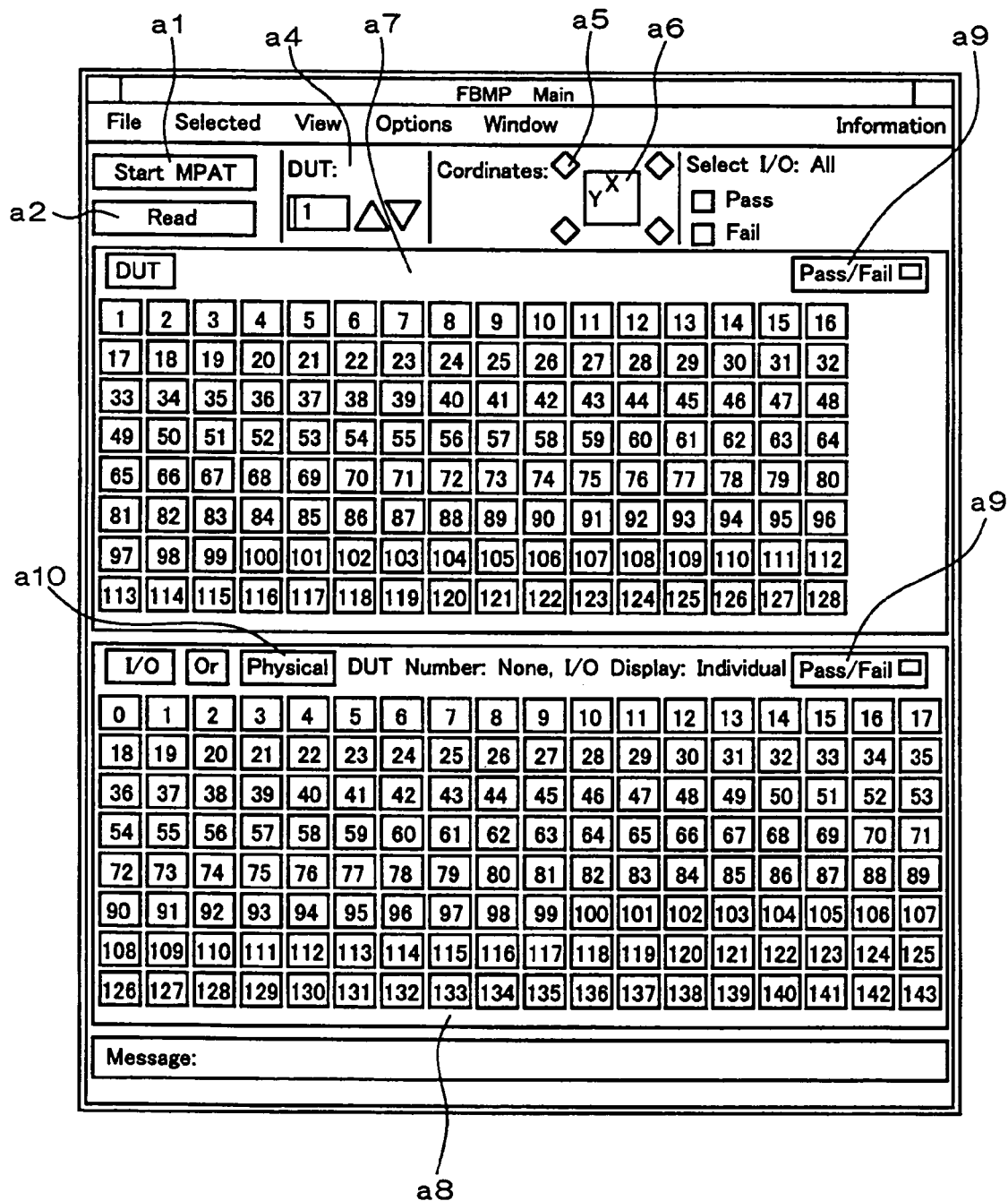
FIG. 4 is a diagram showing a specific example of a main viewer window to be displayed after the fail analysis device is started up.

FIG. 4 is a diagram showing a specific example of the main viewer window to be displayed after the fail analysis device 10 is started up. Each displayed content in the main viewer window will be hereinafter described.

"Start MPAT" Button (a1)

This button is used for instructing the semiconductor test device 100 connected to the fail analysis device 10 to start of a functional test of one or a plurality of DUTs 130 set therein and at the same time instructing the semiconductor test device 100 to capture AFM data and CFM data to be obtained by this functional test.

"Read" Button (a2)

In the case in which the functional test has already ended and fail data are stored in the AFM 118 and CFM 120, this button is used for instructing the semiconductor test device 100 to read these fail data. When this button is depressed, the AFM data is acquired by the detailed data acquiring section 30 and the CFM data is acquired by the reduced data acquiring section 40.

DUT Designation Box and Push Button for Number Designation (a4)

These are used for designating a specific DUT 130 and changing DUT to be designated. A user can designate the specific DUT 130 by directly inputting a number in this box using ten keys provided in the operation section 96. Alternatively, the user can designate the specific DUT 130 by operating the mouse provided in the operation section 96 to depress this push button for the necessary number of times. In order to display a fail map after changing the DUT number, the user needs to depress the above-described "Start MPAT" button a1 or "Read" button a2.

Origin Designation Toggle Buttons (a5)

These buttons are used for designating an origin. A user can designate an arbitrary origin by depressing any of the four buttons. In the case in which a reduced image (described later) of a logical fail bit map is included in the main viewer window, display is performed using designated origin. In addition, in the case in which the logical map viewer window or the physical map viewer window is started up from the main viewer window, the logical map viewer window or the physical map viewer window is displayed using the designated origin.

Axis Change Push Button (a6)

This button is used for designating an X-axis and a Y-axis of a fail bit map. Positive directions of the X-axis and the Y-axis are changed each time this button is pressed. Note that, in the case in which the logical viewer window or the physical viewer window is started up from the main viewer window, an origin designated here is used to display the logical map viewer window or the physical map viewer window.

DUT Data Display Area (a7)

This area is used for displaying a result image indicating a test result of each of the plurality of DUTs 130 which were objects of the test. A number included in each result image shown in a rectangular shape indicates a DUT number, and pass/fail of the DUT 130 specified by this DUT number is represented by a color in this rectangle. For example, in the case of pass (in the case in which all reduced logical data corresponding to this DUT number are pass), the rectangle is colored green and, in the case of fail (in the case in which at least one of the reduced logical data corresponding to this DUT number is fail), the rectangle is colored red. Note that, although DUT numbers of 1 to 128 are shown in the DUT data display area a7 shown in FIG. 4, in the case in which the number of DUTs 130 actually implemented in the semiconductor test device 100 is fewer than 128, numbers in rectangles in which corresponding DUT 130 does not exist is not displayed or shadowed. When a notice is sent to the fail analysis device 10 from the semiconductor test device 100, information on the number of the DUT 130 and an I/O number to be described next is read and these numbers are updated. In addition, in the case in which the number of DUTs 130 actually implemented in the semiconductor test device 100 exceeds 128, pages in which result images of the 128 DUTs 130 are included are switched to be displayed.

I/O Data Display Area (a8)

This area is used for displaying a test image showing a test result for each I/O number concerning a specific DUT 130 for which a DUT number is designated. A number included in each result image shown in a rectangular shape indicates an I/O number, pass/fail of a logical fail bit map designated by this I/O number is represented by a color in this rectangle. For example, in the case of pass (in the case in which all reduced logical data corresponding to this I/O number are pass), the rectangle is colored green and, in the case of fail (in the case in which at least one of the reduced logical data corresponding to this I/O number is fail), the rectangle is colored red. Note that, although I/O numbers of 0 to 143 are shown in the I/O data display area a8 shown in FIG. 4, in the case in which a maximum value of the I/O number of DUTs 130 actually implemented in the semiconductor test device 100 is fewer than 143, numbers in rectangles in which corresponding I/O number does not exist is not displayed or shadowed. In addition, in the case in which the maximum value of I/O numbers exceeds 143, the numbers are displayed by switching pages.

Display Switching Option Menu (a9)

This menu is used for switching displayed contents in the above-described DUT data display area a7 or I/O data display area a8. For the DUT data display area a7, display options of "Pass/Fail", "CFM (All)", "CFM (16 DUT)", and "CFM (32 DUT)" are prepared. In addition, for the I/O data display area 8a, display options of "Pass/Fail", "CFM (All)", "CFM (16 or 18 I/O)", and "CFM (32 or 36 I/O)" are prepared.

"Pass/Fail" is an option for displaying the above-described result image indicating pass/fail of a test result. In an initial screen of the main viewer window shown in FIG. 4, a state in which this display option is selected as default at the start-up time is shown.

In addition, each of "CFM (All)", "CFM (16 DUT)", "CFM (32 DUT)", "CFM (16 or 18 I/O)", and "CFM (32 or 36 I/O)" is an option for displaying reduced images showing logical fail bit maps corresponding to reduced logical data (hereinafter referred to as "reduced logical map") by a number in parentheses. A specific display example of the reduced image will be described later.

"Physical" Button (a10)

This button is used for instructing display of a physical viewer window corresponding to a specific DUT 130 for which a DUT number is designated.

In a state in which the main viewer window shown in FIG. 4 is displayed, then, the GUI processing section 98 judges whether or not a display option has been changed (step 101), whether or not a DUT number has been changed (step 102), whether or not an I/O number has been designated (step 103), and whether or not physical conversion has been instructed (step 104).

All the display options other than "Pass/Fail" included in the display switching option menu are options for displaying a list of reduced logical maps. If these display options are selected, affirmative judgment is made in the judgment of step 101 and, next, based upon the changed display option, the main viewer generating section 80 changes displayed contents of the main viewer window (step 105).

Figure 5:
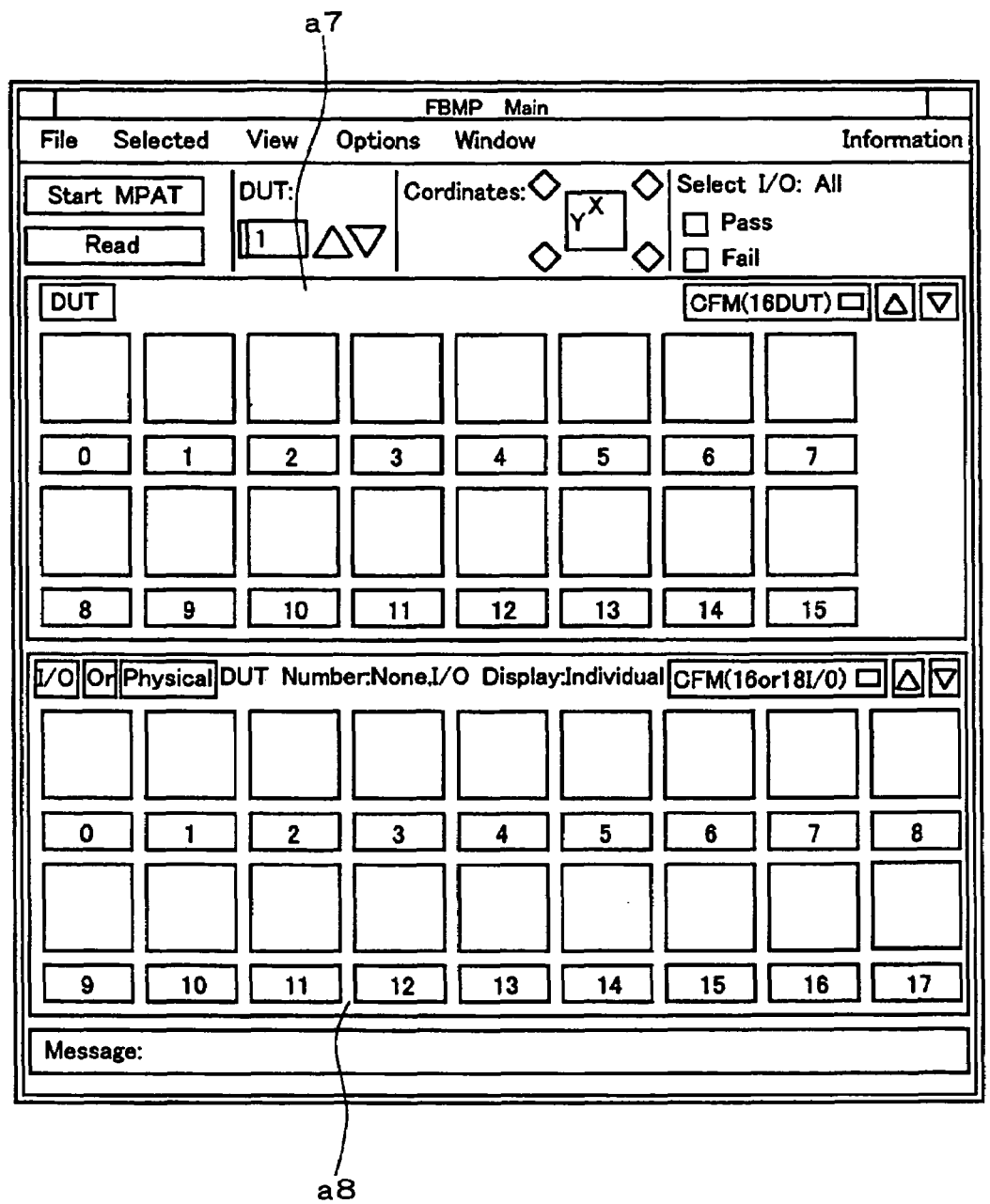
FIG. 5 is a diagram showing a specific example of a main viewer window in which a list of reduced images indicating reduced logical maps is included.

FIG. 5 is a diagram showing a specific example of the main viewer window in which a list of reduced images showing reduced logical maps is included. For example, a state in which "CFM (16 DUT)" is selected as a display option corresponding to the DUT data display area a7 and "CFM (16 or 18 I/O)" is selected as a display option corresponding to the I/O data display area a8 is shown.

In the DUT data display area a7, a rectangular area in which a number is included has the same contents as in the case in which "Pass/Fail" is selected as a display option, and corresponds to a result image showing pass/fail of the DUT 130 designated by this number. A rectangular area located above it shows a reduced image showing contents of a reduced logical map for each DUT 130. Since CFM data (reduced logical data) for each I/O number is read out from the CFM 120 in the semiconductor test device 100, the main viewer generating section 80 finds OR of each bit of reduced logical data of all the I/O numbers for each DUT 130 to generate this reduced image.

In addition, in the I/O data display area a8, a rectangular area in which a number is included has the same contents as in the case in which "Pass/Fail" is selected as a display option, and corresponds to a result image indicating pass/fail of reduced logical data of the I/O number. A rectangular area located above it shows a reduced image showing contents of a reduced logical map for each I/O number.

Figure 6:
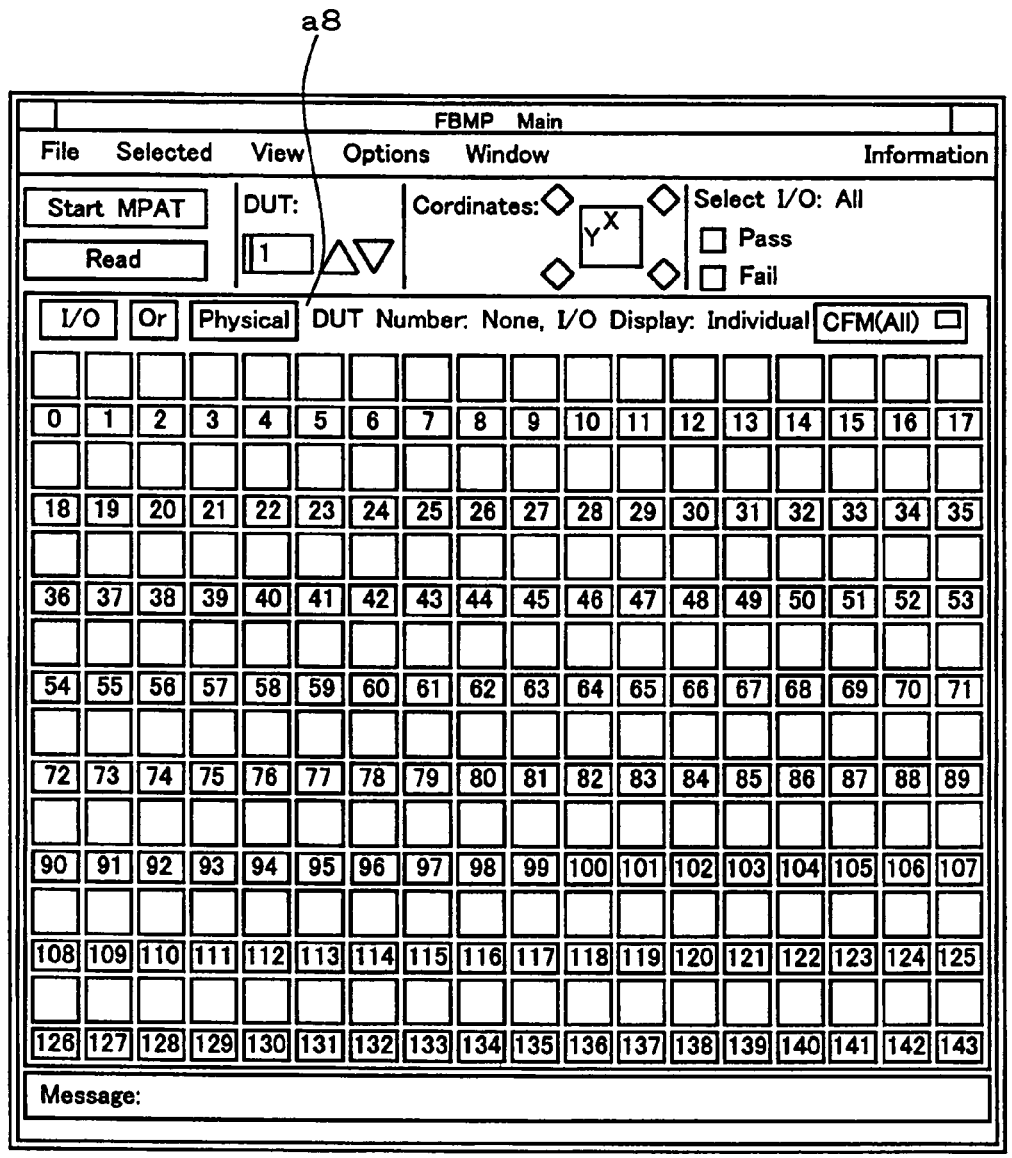
FIG. 6 is a diagram showing another specific example of the main viewer window.

Note that, although both the DUT data display area a7 and the I/O data display area a8 are displayed in the example shown in FIG. 5, it is also possible to bring one of them into a non-display state and increase the number of displayable data of the other. FIG. 6 is a diagram showing a specific example of the main viewer window in the case in which the DUT data display area a7 is brought into the non-display state and, at the same time, "CFM (All)" is selected as a display option of the I/O data display area a8.

In addition, in a state in which the main viewer window is displayed, when a DUT number selected at that point is changed, affirmative judgment is made in the judgment of step 102, and then the main viewer generating section 80 performs change of displayed contents of the I/O data display area a8 corresponding to a DUT number after change (step 106).

Further, in the state in which the main viewer window is displayed, when any I/O number included in the I/O data display area a8 is designated, affirmative judgment is made in the judgment of step 103, and then the logical viewer generating section 82 generates a screen of the logical viewer window corresponding to this designated I/O number and displays it on the display device 94 (step 107).

Figure 7:
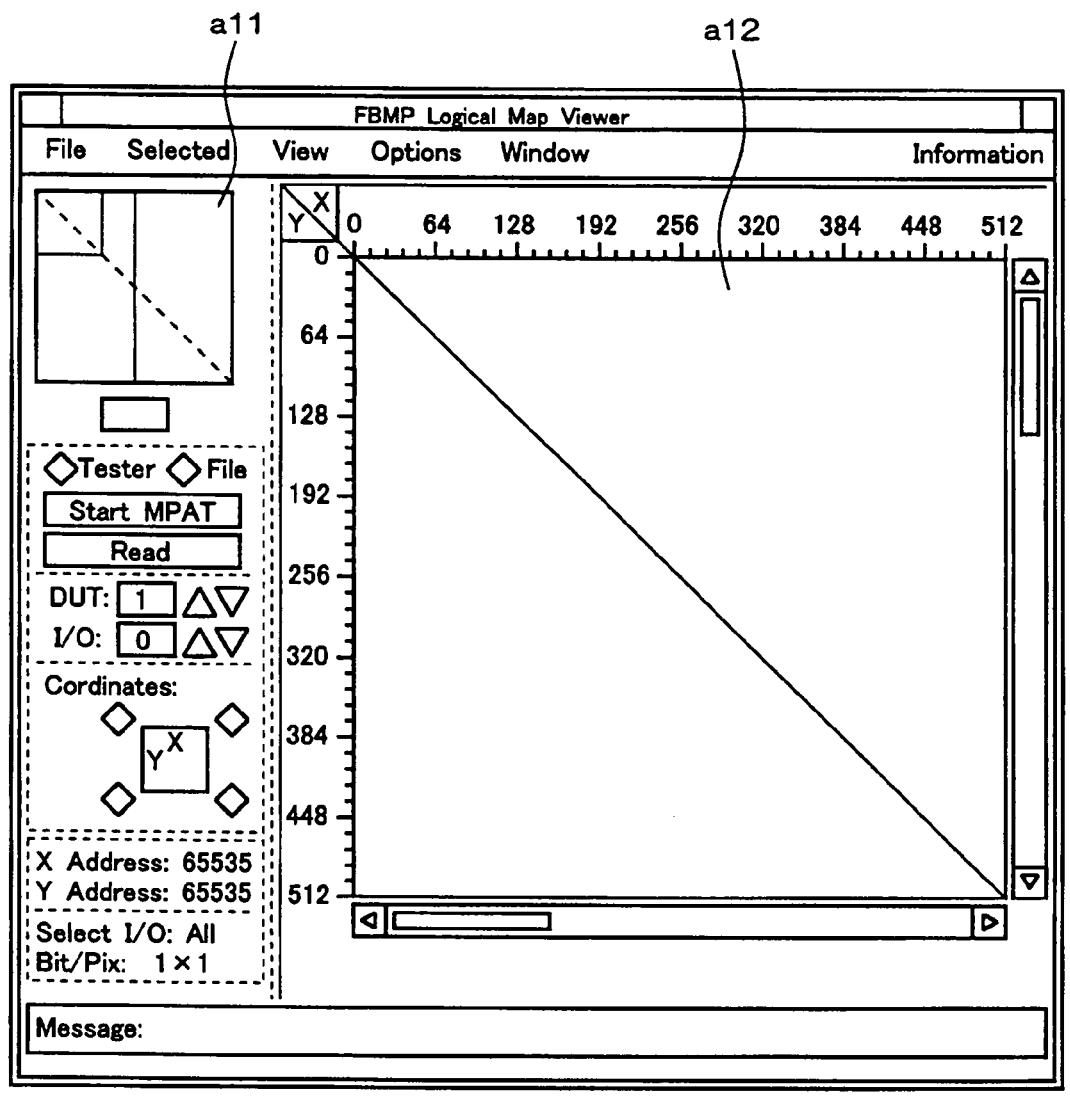
FIG. 7 is a diagram showing a specific example of a logical viewer window.

FIG. 7 is a diagram showing a specific example of the logical viewer window. A reduced logical map a11 and a logical fail bit map a12 corresponding to a part or all of the reduced logical map a11 are included in this window. This logical fail bit map a12 is generated based upon detailed logical data acquired by the detailed data acquiring section 30.

In addition, in the state in which the main viewer window is displayed, when the "Physical" button a10 is selected, affirmative judgment is made in the judgment of step 104, and then the physical viewer generating section 84 generates a screen of the physical viewer window corresponding to the DUT number designated at that point and displays it on the display device 94 (step 108).

Figure 8:
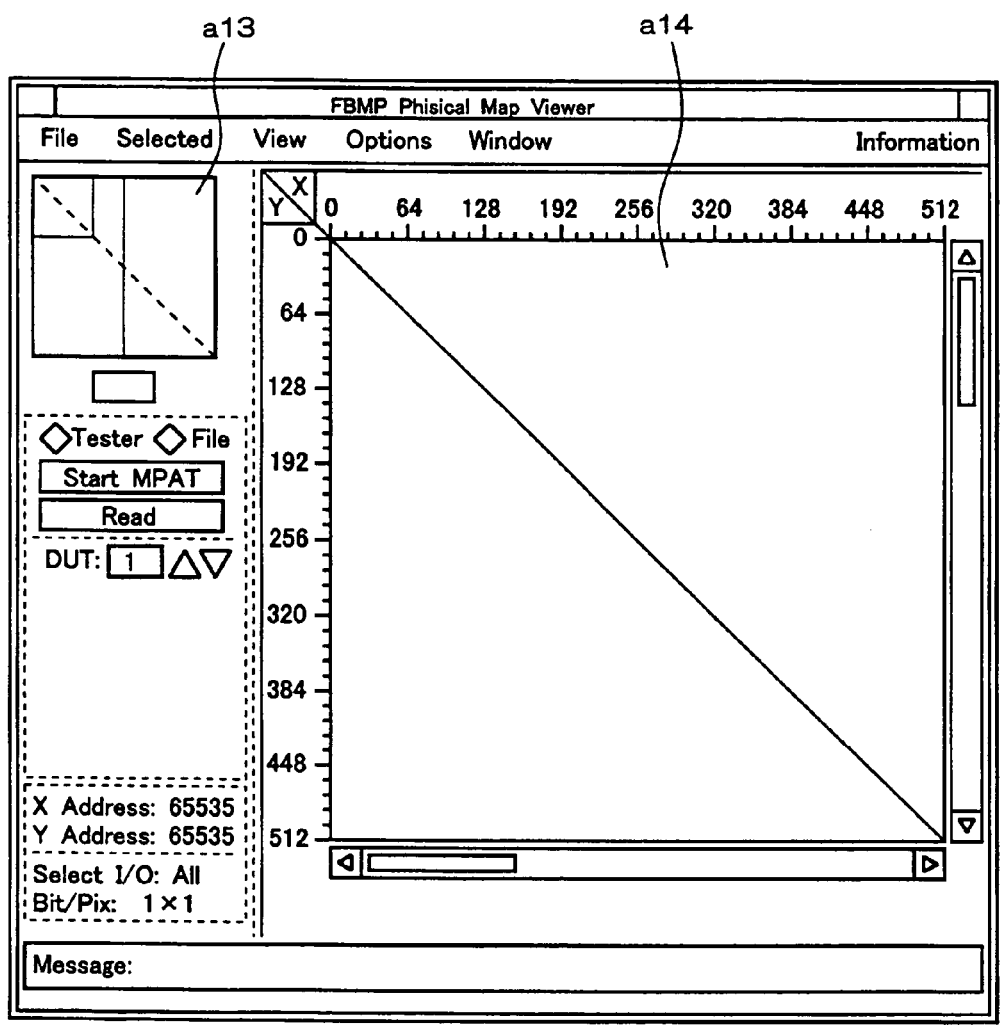
FIG. 8 is a diagram showing a specific example of a physical viewer window.

FIG. 8 is a diagram showing a specific example of the physical viewer window. A reduced physical map a13 and a physical fail bit map a14 corresponding to a part or all of the reduced logical map a13 are included in this window. This physical fail bit map a14 is generated based upon detailed logical data acquired by the detailed data acquiring section 30.

In this way, in the fail analysis device 10 of this embodiment, since test results corresponding to the plurality of DUTs 130 are displayed as a list in the main viewer window, a user can easily grasp an outline of fail information of each DUT 130. In particular, since the user can easily grasp presence or absence of fail according to list of result images and can learn a general distribution state of fail according to a list of reduced images of a fail bit map, the user can surely grasp an outline of fail information for each DUT 130 or each I/O number.

In addition, simply by designating any of list images (result images or reduced images) included in the main viewer window, a logical viewer window or a physical viewer window corresponding to the image can be displayed. Consequently, in the case in which a user would like to confirm the detailed contents after he/she looks over the list images, troublesome labors, which are required until contents of a detailed fail bit map corresponding to a specific DUT 130 or a specific I/O number are actually confirmed, are reduced, and simplification of operations becomes possible. In addition, in accordance with the simplification of operations, reduction of a time required to operate also becomes possible.

In particular, since the reduced logical data (CFM data) necessary for display a list of reduced images included in the main viewer window is generated in the semiconductor test device 100, it becomes possible to reduce time until the main viewer window including such a list of reduced images is displayed.

SPECIFIC EXAMPLE 2 OF OPERATIONS

Figure 9:
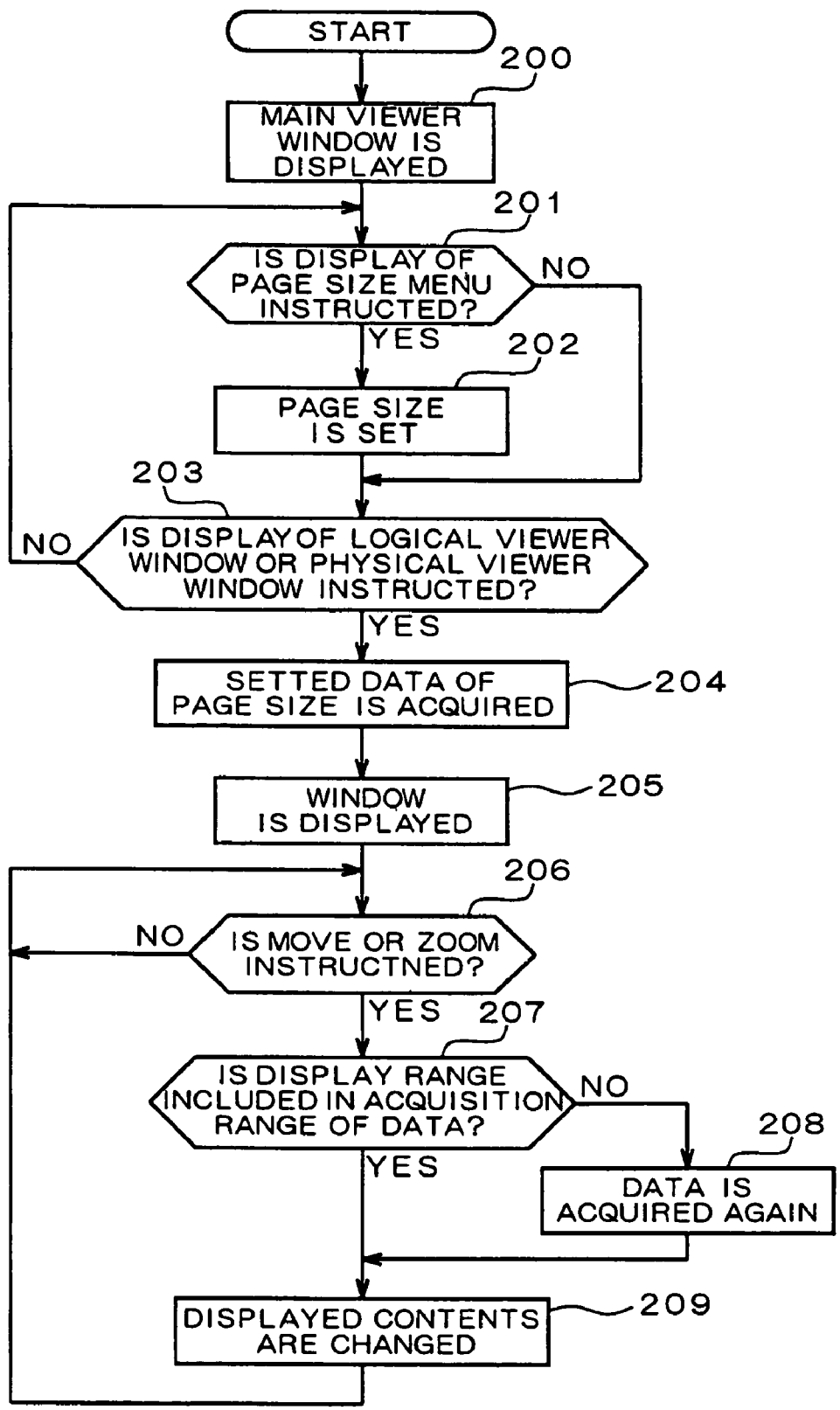
FIG. 9 is a flow diagram showing operation procedures of a fail analysis device corresponding to a specific example 2.

FIG. 9 is a flow diagram showing operation procedures of a fail analysis device corresponding to a specific example 2 and mainly shows operation procedures in the case in which a range of acquiring detailed logical data or detailed physical data is acquired by the detailed data acquiring section 30 is variably set and change of a display range is instructed while a logical viewer window or a physical viewer window is displayed.

When the fail analysis device 10 is started up, first, the man viewer generating section 80 generates a screen of the main viewer window shown in FIG. 4 and displays it on the display section 94 (step 200).

In a state in which the main viewer window shown in FIG. 4 is displayed, next, the GUI processing section 98 judges whether or not display of a page size menu has been instructed (step 201). Here, a page size indicates a range of acquiring data by the detailed data acquiring section 30 set by the acquisition range setting section 32. For example, it is assumed that an item "Page Size" is included in a pull down menu corresponding to "View" in a menu bar displayed in the upper part of the main viewer window. The GUI processing section 98 watches whether or not this item "Page Size" has been clicked by the mouse or pointed using the keyboard, thereby performing the above-described judgment of step 201.

If display of the page size menu is instructed, affirmative judgment is made in the judgment of step 201, and then the acquisition range setting section 32 performs setting of a page size using the page size menu which is displayed in accordance with this instruction (step 202).

Figure 10:
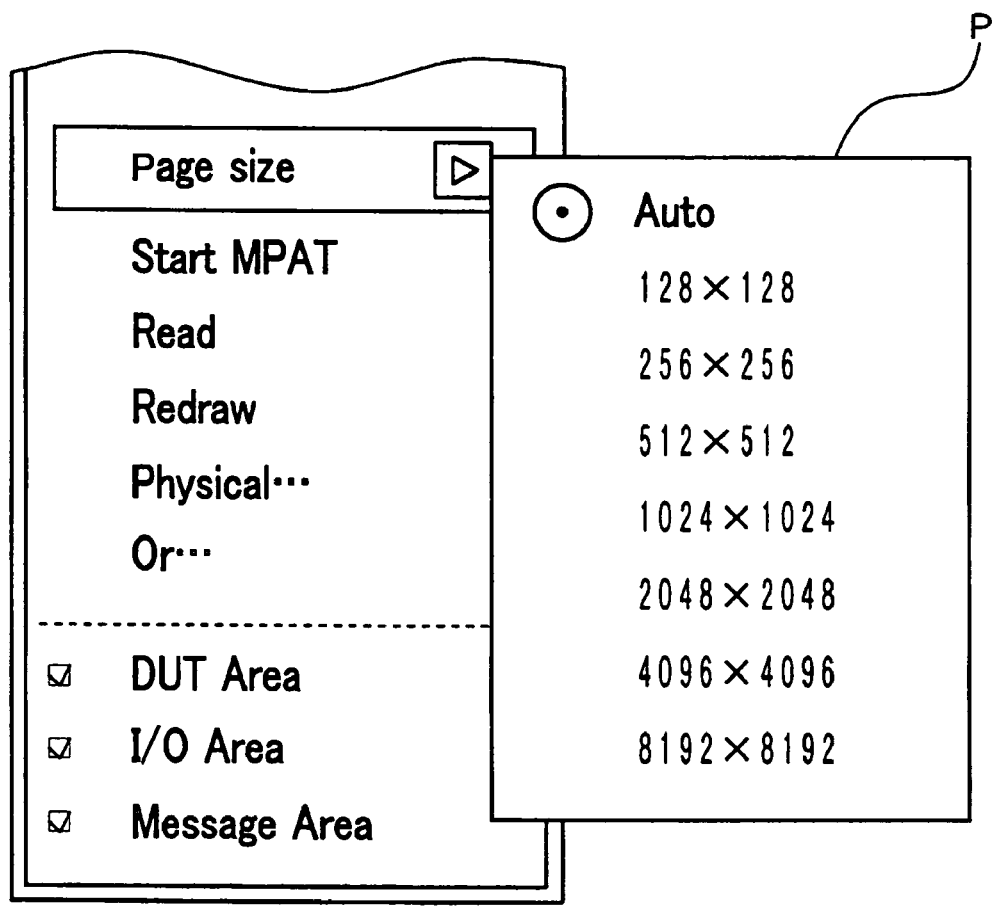
FIG. 10 is a diagram showing a specific example of a page size menu.

FIG. 10 is a diagram showing a specific example of the page size menu. Sizes of fail bit maps which can be acquired by one reading operation by the detailed data acquiring section 30 are listed in the page size menu. More specifically, as shown in FIG. 10, seven sizes of 128 (X address)× 128 (Y address), 256×256, . . . , and 8192×8192 and total eleven kinds of options of "Auto" for automatically setting and changing the page size according to a size of a display range are included in the page size menu P. If "Auto" is selected, a size of a square of a length of minimum power of 2 exceeding a size of a longer address of the display range is set as the page size.

Next, the GUI processing section 98 judges whether or not display of the logical viewer window or the physical viewer window has been instructed (step 203).

In a state in which the main viewer window is displayed, when any I/O number included in the I/O data display area a8 is designated, this means that display of the logical viewer window is instructed. In this case, affirmative judgment is made in the judgment of step 203, and then the detailed data acquiring section 30 acquires detailed logical data for the page size set by the acquisition range setting section 32 in step 202 (step 204). The logical viewer generating section 82 generates a screen of the logical viewer window (FIG. 7) corresponding to the designated I/O number based upon the detailed logical data or the like acquired by the detailed data acquiring section 30 and displays it on the display section 94 (step 205).

In addition, in the state in which the main viewer window is displayed, when the "Physical" button a10 is selected, this means that display of the physical viewer window is instructed. In this case, again, affirmative judgment is made in the judgment of step 203, and then the detailed data acquiring section 30 acquires detailed physical data for the page size set by the acquisition range setting section 32 in step 202 (step 204). The physical viewer generating section 84 generates a screen of the physical viewer window (FIG. 8) corresponding to the DUT number designated at that time based upon the detailed physical data or the like acquired by the detailed data acquiring section 30 and displays it on the display section 94 (step 205).

Next, the GUI processing section 98 judges whether or not move or zoom of a display range of a fail bit map being displayed has been instructed (step 206). In a state in which the logical viewer window or the physical viewer window is displayed, if move or zoom of a display range is instructed using the mouse of the operation section 96, affirmative judgment is made in the judgment of step 206. For example, a user drags the display range while pressing the left button of the mouse on the reduced logical map a11 included in the logical viewer window, whereby zoom processing with respect to the dragged range is instructed. Alternatively, the user drags the display range while pressing the central button of the mouse on the reduced logical map a11, whereby move of the display range in the dragged direction without change of a display magnification is instructed. This is true for the case in which move or zoom of the display range is instructed in a state in which the physical viewer window is displayed.

Next, the acquisition range setting section 32 judges whether or not the display range after change is included in the acquisition range of data by the detailed data acquiring section 30 (step 207). If the display range is not included in the acquisition range of data, negative judgment is made, and then the detailed data acquiring section 30 performs reacquisition of data corresponding to a window to be displayed (step 208). For example, if move or zoom is instructed when the logical viewer window is displayed, acquisition of detailed logical data is performed. In addition, if move or zoom is instructed when the physical viewer window is displayed, acquisition of detailed physical data is performed.

When the display range after change is within the acquisition range of data and affirmative judgment is made in the judgment of step 206, or after reacquisition of data is performed in step 208, the move processing section 187 or the zoom processing section 188 in the display range changing section 186 sends an instruction to the logical viewer generating section 82 or the physical viewer generating section 84 to perform setting of a present display range. Consequently, displayed contents are changed (step 209). Thereafter, the fail analysis device returns to step 206 and the processing is repeated.

Figure 11:
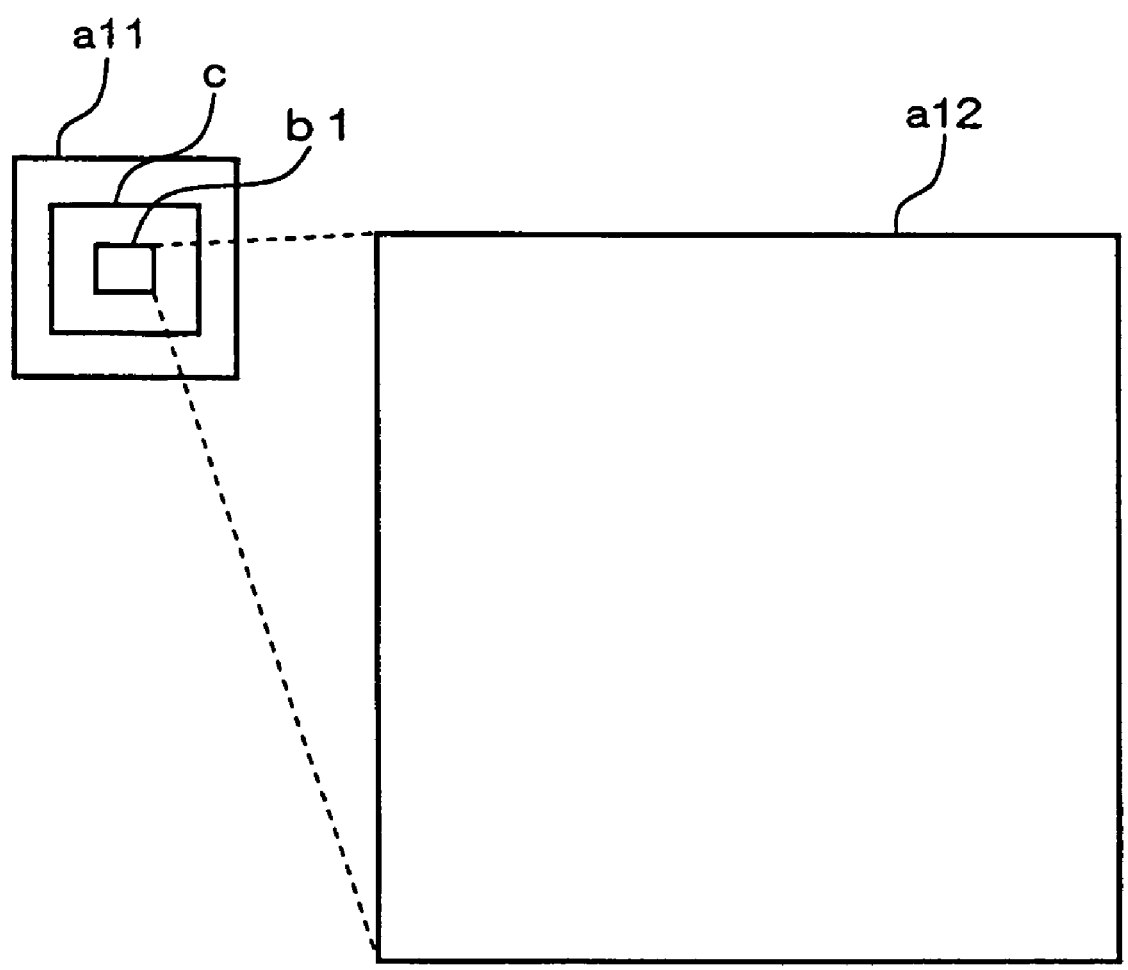
FIG. 11 is a diagram showing a relation between a display range and an acquisition range of data.

FIG. 11 is a diagram showing a relation between a display range and an acquisition range of data. For example, a correspondence relation between the reduced logical map a11 included in the logical viewer window and the detailed logical fail bit map a12 is shown. Note that this is true for the case in which the physical viewer window is used, and a specific example of operation instruction using the logical viewer window will be described in the following description.

As shown in FIG. 11, an acquisition frame c indicating the acquisition range of data at that point and a display frame b1 indicating a drawing range of the logical fail bit map a11, which is a display range, at that point are included in an image of the reduced logical map a11 in the logical viewer window. In the fail analysis device 10 of this embodiment, the acquisition frame c larger than the display frame b1 is set. In addition, an instruction of move or zoom of the display range is given using the reduced logical map a11 in which the display frame b1 and the acquisition frame c are displayed.

Figure 12:
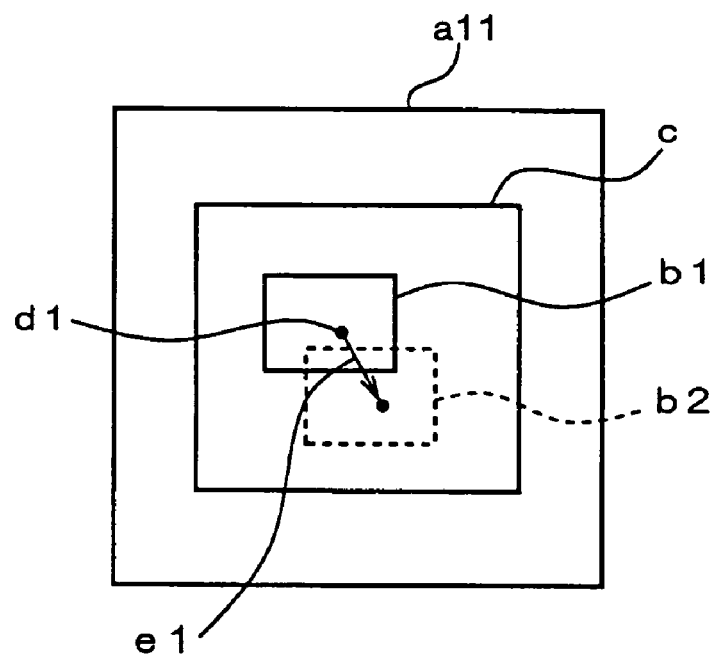
FIG. 12 is a diagram showing a specific example of an instruction of move using a reduced logical map.

FIG. 12 is a diagram showing a specific example of a move instruction using the reduced logical map a11. As shown in FIG. 12, a user operates the mouse to designate an arbitrary position d1 in the display frame b1 and, while pressing the central button of the mouse in this state, drags the display range in a direction and to a position as indicated by arrow e1 in the drawing. Consequently, the user can move a display range b1 to a display range b2. In addition, in accordance with this move operation, displayed contents of the logical fail bit map a12 in the logical viewer window change continuously.

Figure 13:
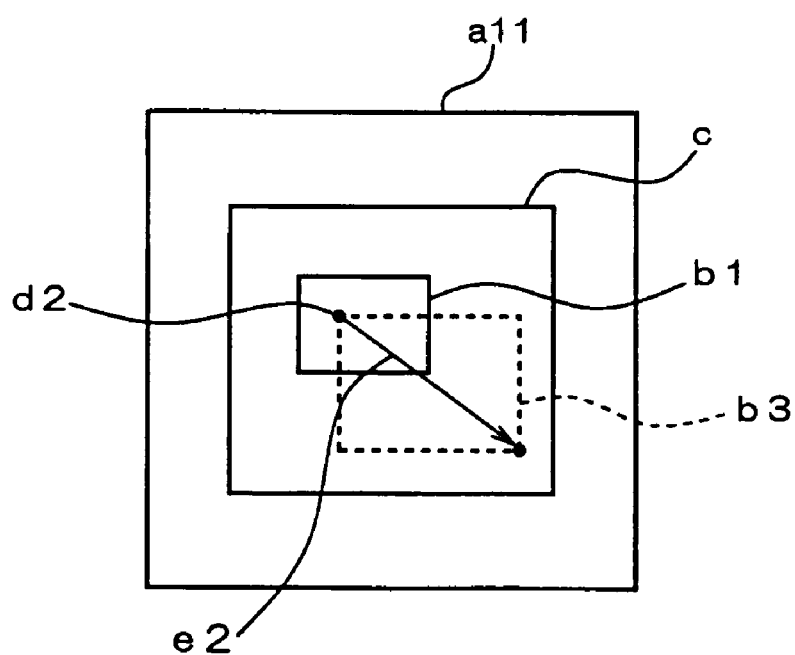
FIG. 13 is a diagram showing a specific example of instruction of zoom using the reduced logical map.

FIG. 13 is a diagram showing a specific example of a zoom instruction using the reduced logical map a11. As shown in FIG. 13, a user operates the mouse to designate an arbitrary position d2 in the display frame b1 and, while pressing the left button of the mouse in this state, drags the display range in a direction and to a position as indicated by arrow e2 in the drawing. Consequently, zoom-up processing for changing the display range b1 to the display range b3 can be performed. Note that, in the case in which the display range b2 after the operation is smaller than the display range b1 before the operation, zoom-in processing is performed.

In this way, in the fail analysis device of this embodiment, a range in which detailed logical map data or detailed physical map data as a test result is acquired is made larger than a display range of a detailed logical map or physical map. Thus, in performing move or zoom of the display range of the detailed logical map or the detailed physical map, the user does not need to perform reacquisition of data in the case in which move or zoom is performed in the acquisition range of data. Therefore, time required since change of a display range is instructed until the display range is actually changed can be reduced.

In addition, in the case in which the page size, which is the acquisition range of data, is set to "Auto", if the display range of the detailed logical map or the like is large, the acquisition range of data is also set large and, to the contrary, if the display range is small, the acquisition range of data is also set small. Thus, waste of acquiring data even for a range almost unnecessary for display can be cut down, and the most suitable processing of the fail analysis device taking into account processing capability and the like becomes possible.

In addition, in the case in which the display range is moved or zoomed, since it is sufficient to perform reacquisition of data only if the display range exceeds the acquisition range of data, the number of times of this reacquisition can be minimized.

Further, the reduced logical map a11 and the detailed logical fail bit map a12 are included in the logical viewer window and a user can perform an instruction operation of move or zoom of the display range using this reduced logical map a11, the user does not need to switch to a detailed display screen after roughly confirming contents on a reduced display screen as in the past, and operability in giving an instruction of switching can be improved. This is true for the case in which the physical viewer window is used.

In particular, since the user can perform designation of a new display range by designating two points in the reduced logical map a11 or the reduced physical map a13 using a pointing device such as a mouse and dragging the display range between the two points, the user can perform designation of a range of zoom-in or zoom-out easily and with the same operation procedures. In addition, since the user can perform designation of a new display range by designating an arbitrary one point in the reduced logical map a11 or the reduced physical map a13, a moving direction, and a moving amount, the user can easily give an instruction to move the display range.

Further, since the user can give an instruction of move or zoom of the display range while confirming the acquisition range of data by including the display frame b1 and the acquisition frame c in an image of the reduced logical map a11 or the like, for which an operation instruction of move or zoom is performed, it becomes possible to give these instructions within the acquisition range of data.

SPECIFIC EXAMPLE 3 OF OPERATIONS

Figure 14:
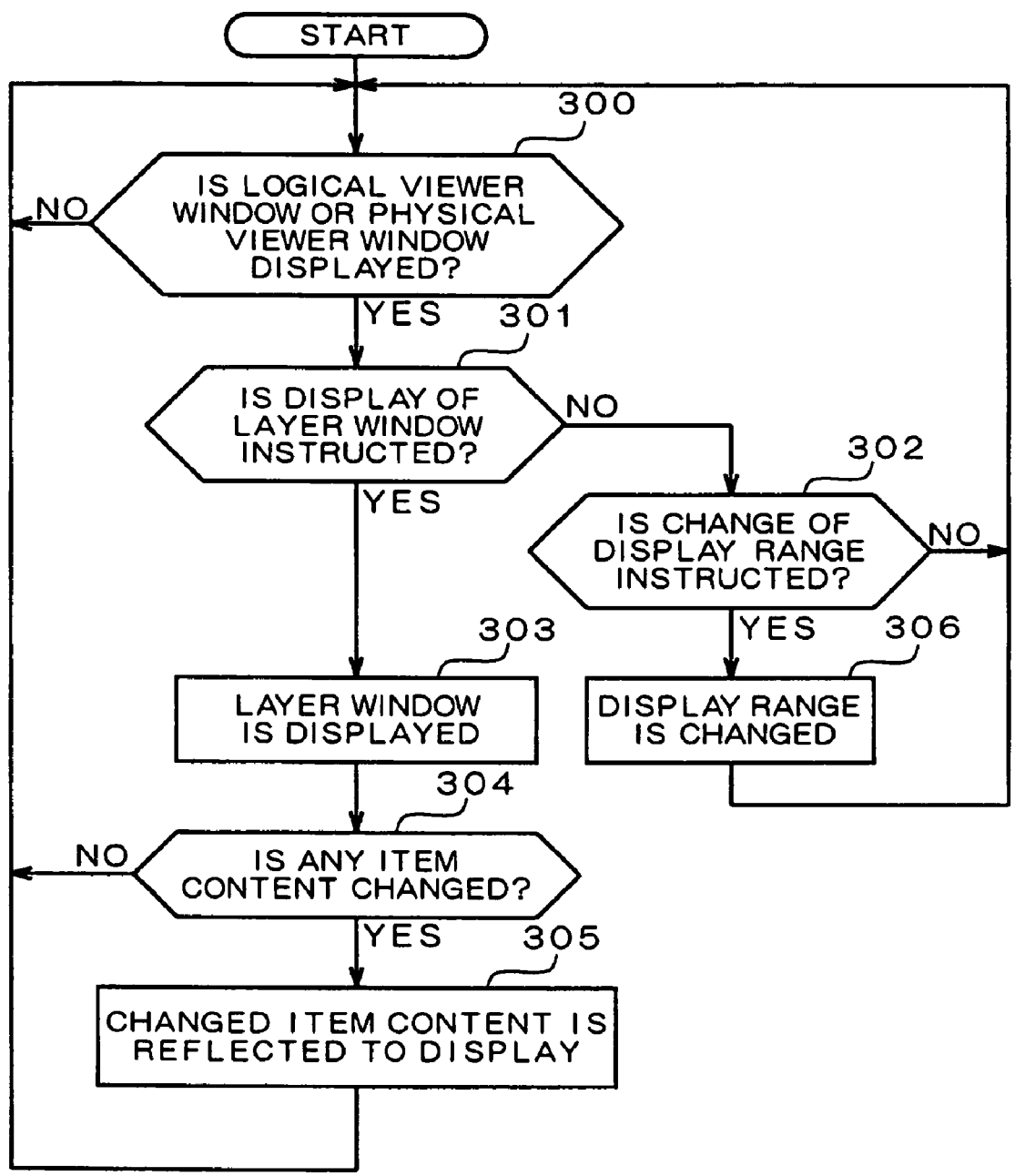
FIG. 14 is a flow diagram showing operation procedures of a fail analysis device corresponding to a specific example 3.

FIG. 14 is a flow diagram showing operation procedures of a fail analysis device corresponding to a specific example 3 and mainly shows operation procedures in the case in which various setting contents set by using a layer window are reflected on display and a display range of superimposed images is changed.

When the fail analysis device 10 is started up, the layer control section 86 judges whether or not a logical viewer window or a physical viewer window is displayed (step 300).

For example, the logical viewer window or the physical viewer window can be displayed by performing a predetermined operation in a state in which a main viewer window is displayed. Next, a specific method in the case in which the logical viewer window or the physical viewer window is started up from the main viewer window will be described.

As described above, a specific example of the main viewer window to be displayed after the fail analysis device 10 is started up is shown in FIG. 4. In addition, a specific example of the main viewer window in which a list of reduced images showing a reduced logical map is included is shown in FIG. 5. Further, a specific example of the logical viewer window is shown in FIG. 7 and a specific example of the physical viewer window is shown in FIG. 8.

Note that, although both the DUT data display area a7 and the I/O data display area a8 are displayed in the example shown in FIG. 5, it is also possible to bring one of them into a non-display state and increase the number of displayable data of the other (FIG. 6).

When any I/O number included in the I/O data display area a8 is designated in a state in which the above-described main viewer window is displayed, this means that display of the logical viewer window is instructed.

In addition, when the "Physical" button a10 is selected in the state in which the main viewer window is displayed, this means that display of the physical viewer window is instructed.

When the logical viewer window or the physical viewer window is displayed in this way, affirmative judgment is made in the judgment of step 300, and then the GUI processing section 98 judges whether or not display of the layer window is instructed (step 301). For example, it is assumed that an item "Layers . . . " for instruction display of the layer window is included in a pull down menu corresponding to "View" in a menu bar displayed in the upper part of the logical viewer window or the physical viewer window in display. The GUI processing section 98 watches whether or not this item "Layers . . . " has been clicked by the mouse or pointed using the keyboard, thereby performing the above-described judgment of step 301.

If display of the layer window is not instructed, negative judgment is performed in the judgment of step 301, and then the GUI processing section 98 judges whether or not change of a display range of a fail bit map being displayed has been instructed (step 302). If change of the display range is not instructed, the fail analysis device returns to step 300 and the processing is repeated.

In addition, if display of the layer window is instructed, affirmative judgment is made in the judgment of step 301, and then the layer control section 86 generates an image of the layer window and displays it on the display section 94 (step 303).

Figure 15:
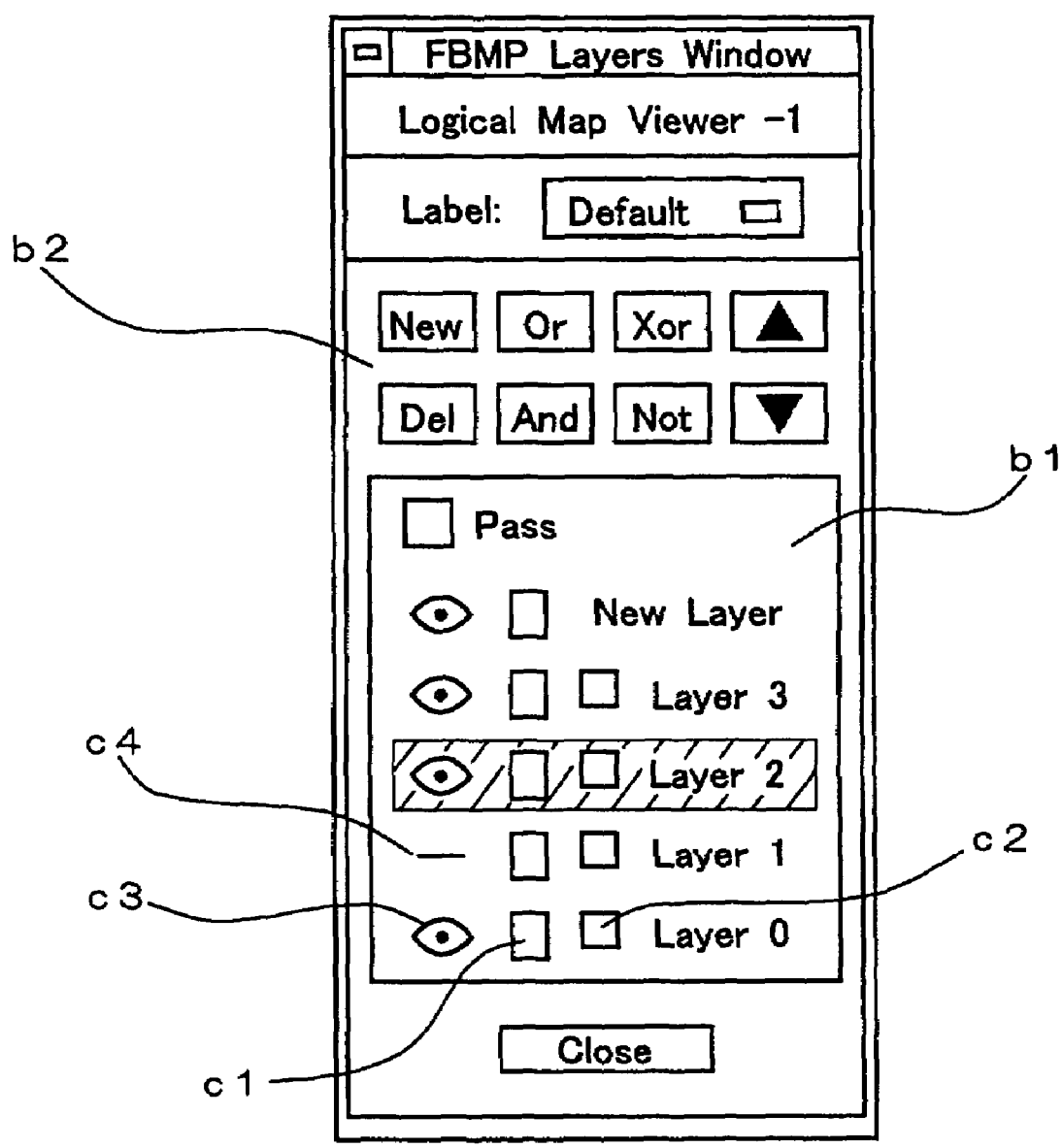
FIG. 15 is a diagram showing a specific example of a layer window.

FIG. 15 is a diagram showing a specific example of the layer window. A layer display area b1 and a button area b2 are included in this window. When a user operates the mouse to click a layer name ("Layer 0", etc.) included in the layer display area b1, a part where this layer is shown turns into reversal display, and a logical viewer window or a physical viewer window corresponding to this layer becomes operable. A fail color designation box c1 is used for, in the case in which a fail part is included in a fail bit map corresponding to the layer, designating a color of the fail part. The color of the fail part can be set arbitrarily using this fail color designation box c1 because a fail distribution of each fail bit map becomes unclear if all fail parts of fail bit maps to be superimposed are colored in the same color. A check button c2 is a button for designating a layer to be an object of processing in the case in which processing corresponding to various buttons included in the button area b1 is performed. A visible display mark c3 and an invisible mark c4 set a display state of a logical map or a physical map corresponding to the layer and indicate contents of the set display state. Display of these marks is switched every time a user operates the mouse to click the marks.

In addition, the button area b2 includes a plurality of buttons for designating various contents of processing with respect to a logical viewer window or the like corresponding to each layer. A "New" button is used for instructing addition of a new layer. A display position of a layer to be added is the top (forefront). A "Del" button is used for deleting a selected (reversely displayed) layer. An "Or" button is a button for instructing execution of an OR operation using various fail bit maps corresponding to a selected layer. An "And" button is a button for instructing execution of an AND operation using various fail bit maps corresponding to a selected layer. An "Xor" button is a button for instructing execution of an exclusive OR operation using a fail bit map corresponding to each of two layers. In the case in which three or more layers are selected, top two layers are automatically selected. A "Not" is a button for instructing execution of a logical NOT operation with respect to each of various fail bit maps corresponding to a selected layer.

In a state in which the above-described layer window is displayed, the GUI processing section 98 judges whether or not any item content included in the layer window is changed (step 304). If the layer window is closed without any change, negative judgment is made, and the above-described judgment processing of step 300 is repeated.

If any item content in the layer window is changed, affirmative judgment is made in the judgment of step 304, and the logical viewer generating section 82 or the physical viewer generating section 84 performs display reflecting this changed item content (step 305). After this display processing is performed, the fail analysis device returns to step 300 and the processing is repeated.

Further, in a state in which a logical viewer window or a physical viewer window is displayed, in the case in which change of a display range is instructed using the mouse, affirmative judgment is made in the judgment of step 302. For example, a user drags the display range while pressing the left button of the mouse on the reduced logical map a11 included in the logical viewer window, whereby zoom processing with respect to the dragged range is instructed. Alternatively, the user drags the display range while pressing the central button of the mouse on the reduced logical map a11, whereby move processing of the display range in the dragged direction without change of a display magnification is instructed. This is true for the case in which change of the display range is instructed in a state in which the physical viewer window is displayed.

Next, the display range changing section 87 sends an instruction to the logical viewer generating section 82 or the physical viewer generating section 84 to perform change of a present display range (step 306). Thereafter, the fail analysis device returns to step 300 and the processing is repeated.

Figure 16:
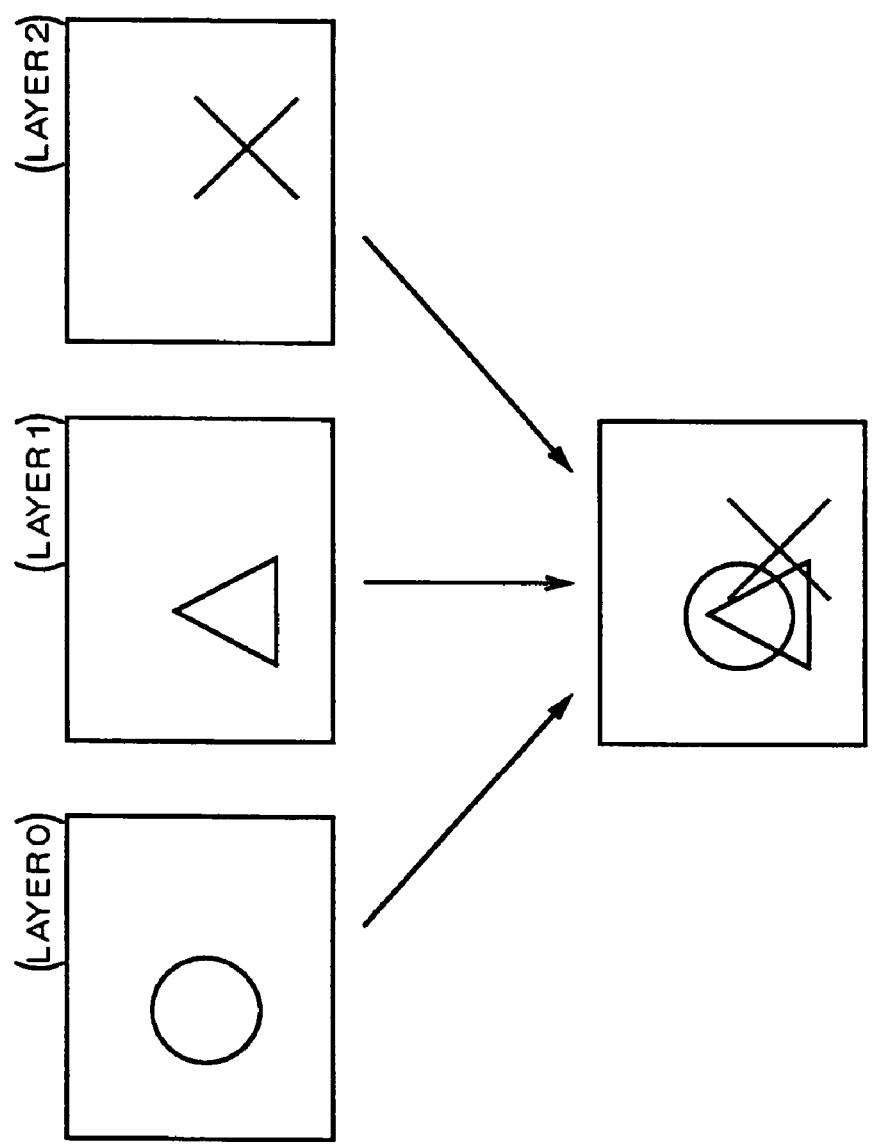
FIG. 16 is a diagram showing a specific example of superimposition of fail bit maps.

FIG. 16 is a diagram showing a specific example of superimposition of fail bit maps. For example, it is assumed that fail bit maps of different contents are correspondent to each of a layer 0, a layer 1, and a layer 2. Note that, description is made with the case in which logical fail bit maps are superimposed as an example in the following description, the same is true for physical fail bit maps.

Figure 17:
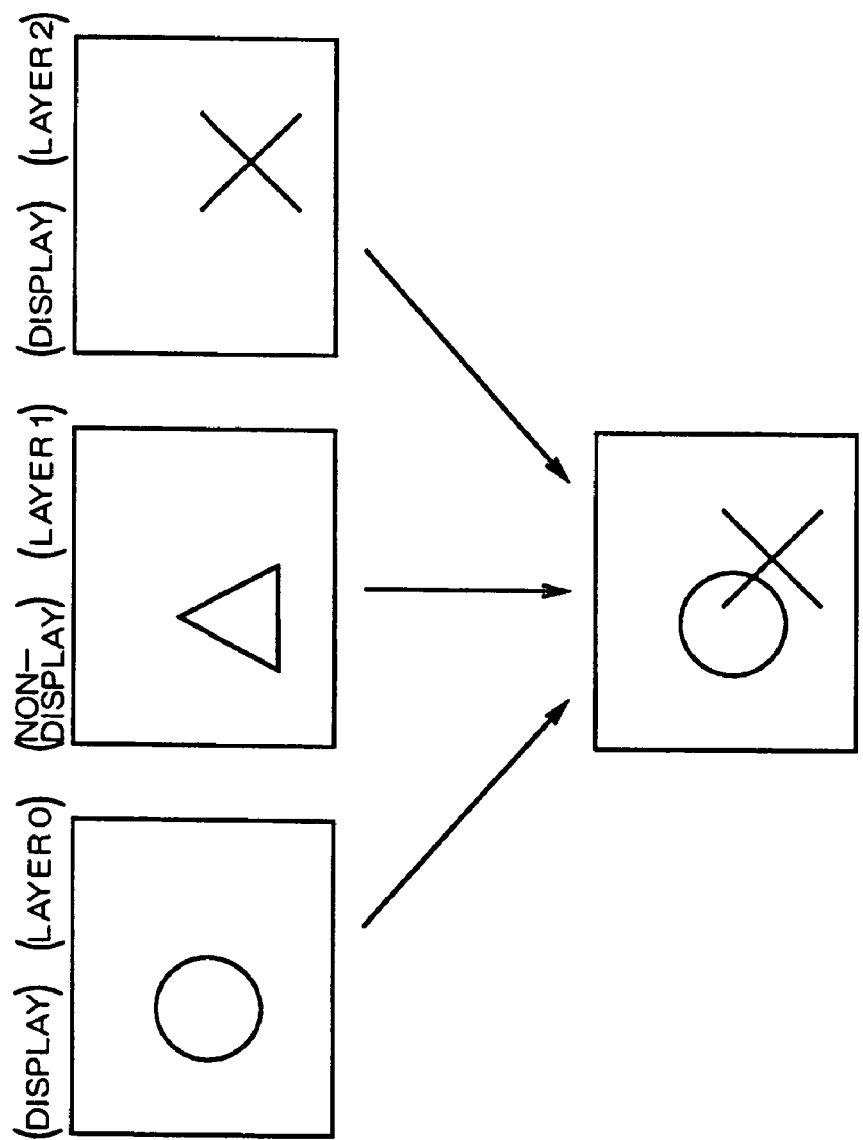
FIG. 17 is a diagram showing another specific example of superimposition of fail bit maps.

In this case, contents of the reduced logical map a11 and the logical fail bit map a12 of the logical viewer window shown in FIG. 7 are contents of superimposed three fail bit maps corresponding to these three layers 0, 1, and 2. In this case, if different colors are set for each layer using the fail color designation box cl included in the layer display area b1 of the layer window, different colors are given to fail parts of the respective fail bit maps. In the case in which if there is a layer in which the invisible mark c4 is set and non-display is set in the layer display area b1 of the layer window, as shown in FIG. 17, the fail bit map corresponding to this layer is not used for superimposition of images.

Note that an order of superimposition of the fail bit maps corresponding to the respective layers corresponds to layer numbers. For example, the layer 0 is the lowermost layer, a layer having the larger layer number is an upper layer, and the largest layer number corresponds to the layer in the forefront. Therefore, the order of superimposition can be changed easily by changing the layer numbers. Change of the layer numbers is performed by clicking an arrow button, which is arranged in the vicinity of the right end of the button area b2 of the layer window, with a mouse. When the user desires to change an order of superimposition of a fail bit map, which corresponds to a layer reversed in the layer display area b1, to an immediately higher or lower order, the user only has to click an upward arrow button or a downward arrow button once.

Figure 18:
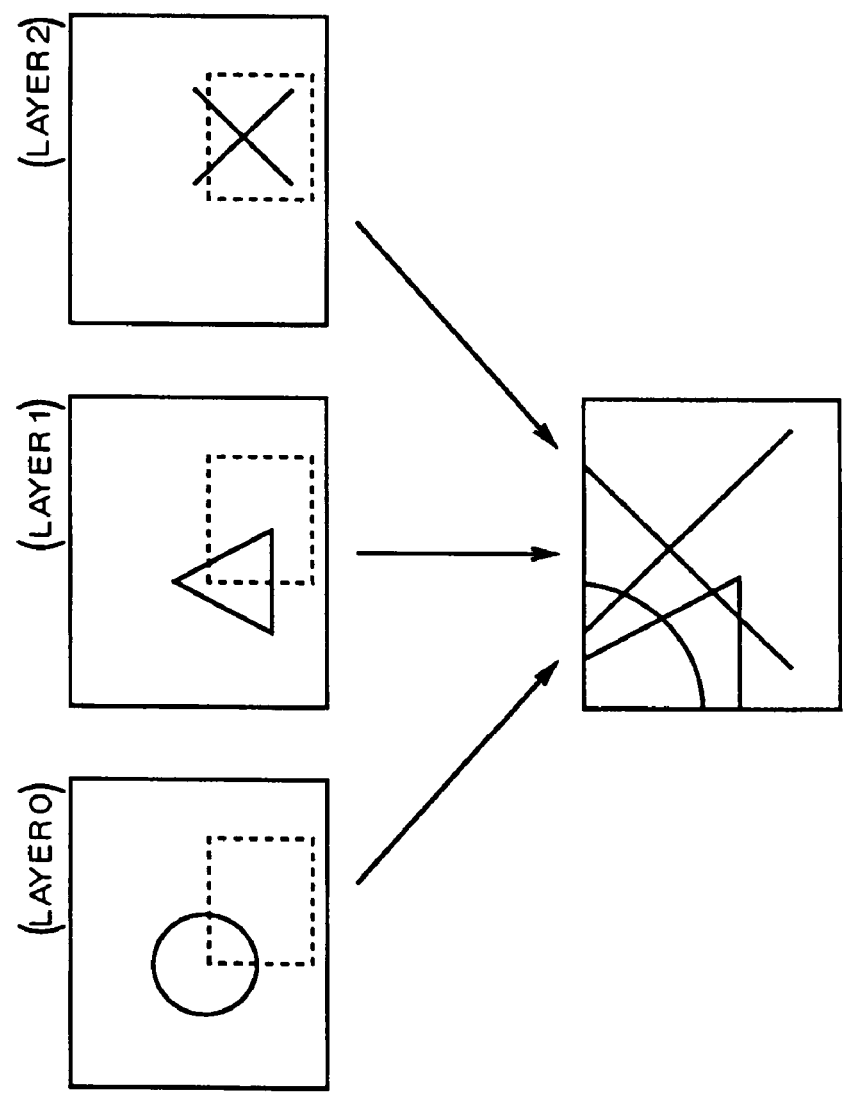
FIG. 18 is a diagram showing another specific example of superimposition of fail bit maps.

FIG. 18 is a diagram showing another specific example of superimposition of fail bit maps and shows an outline in the case in which zoom processing is performed to change a display range. Various operations using the logical viewer window becomes possible with respect to a layer (e.g., the layer 1) reversed in the layer display area b1 of the layer window. However, in this embodiment, in the case in which the zoom processing is instructed using the reduced logical map a11 in the logical viewer window, the zoom processing is performed simultaneously not only for a logical map corresponding to the layer 1 but also for respective logical maps corresponding to the other layers 0 and 2 related by using the layer window. As a result, an image obtained by superimposing images, which are logical maps corresponding to the respective layers 0, 1, and 2 individually subjected to the zoom processing, is displayed in the logical viewer window after executing the zoom processing.

Figure 19:
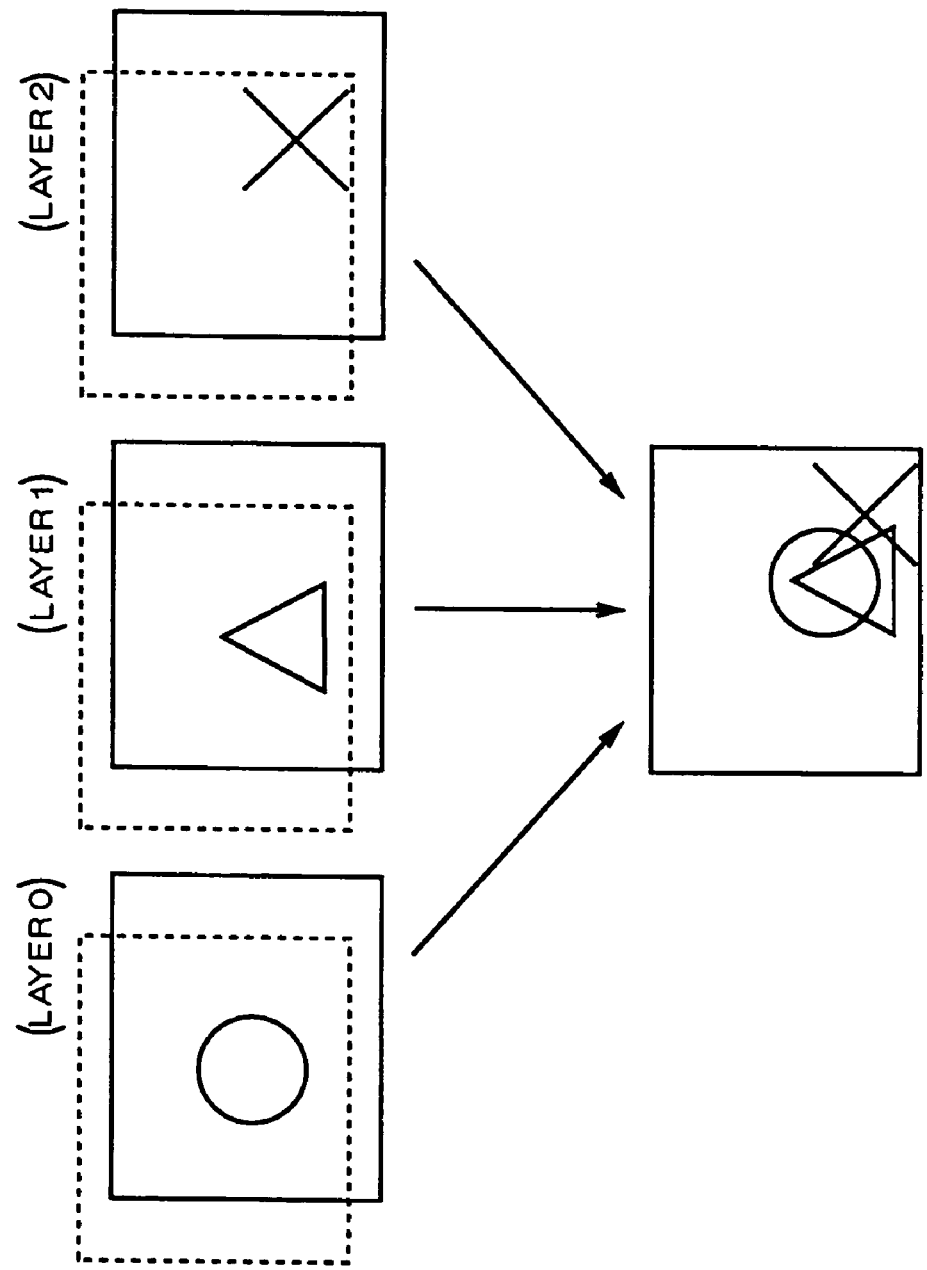
FIG. 19 is a diagram showing another specific example of superimposition of fail bit maps.

FIG. 19 is a diagram showing another specific example of superimposition of fail bit maps and shows an outline in the case in which a display range is changed by performing move processing. In the case in which the move processing is instructed using the reduced logical map a11 in the logical viewer window, the move processing is performed simultaneously not only for a logical map corresponding to the layer 1 but also for respective logical maps corresponding to the other layers 0 and 2 related by using the layer window. As a result, an image obtained by superimposing images, which are logical maps corresponding to the respective layers 0, 1, and 2 individually subjected to the move processing, is displayed in the logical viewer window after executing the move processing.

Figure 20:
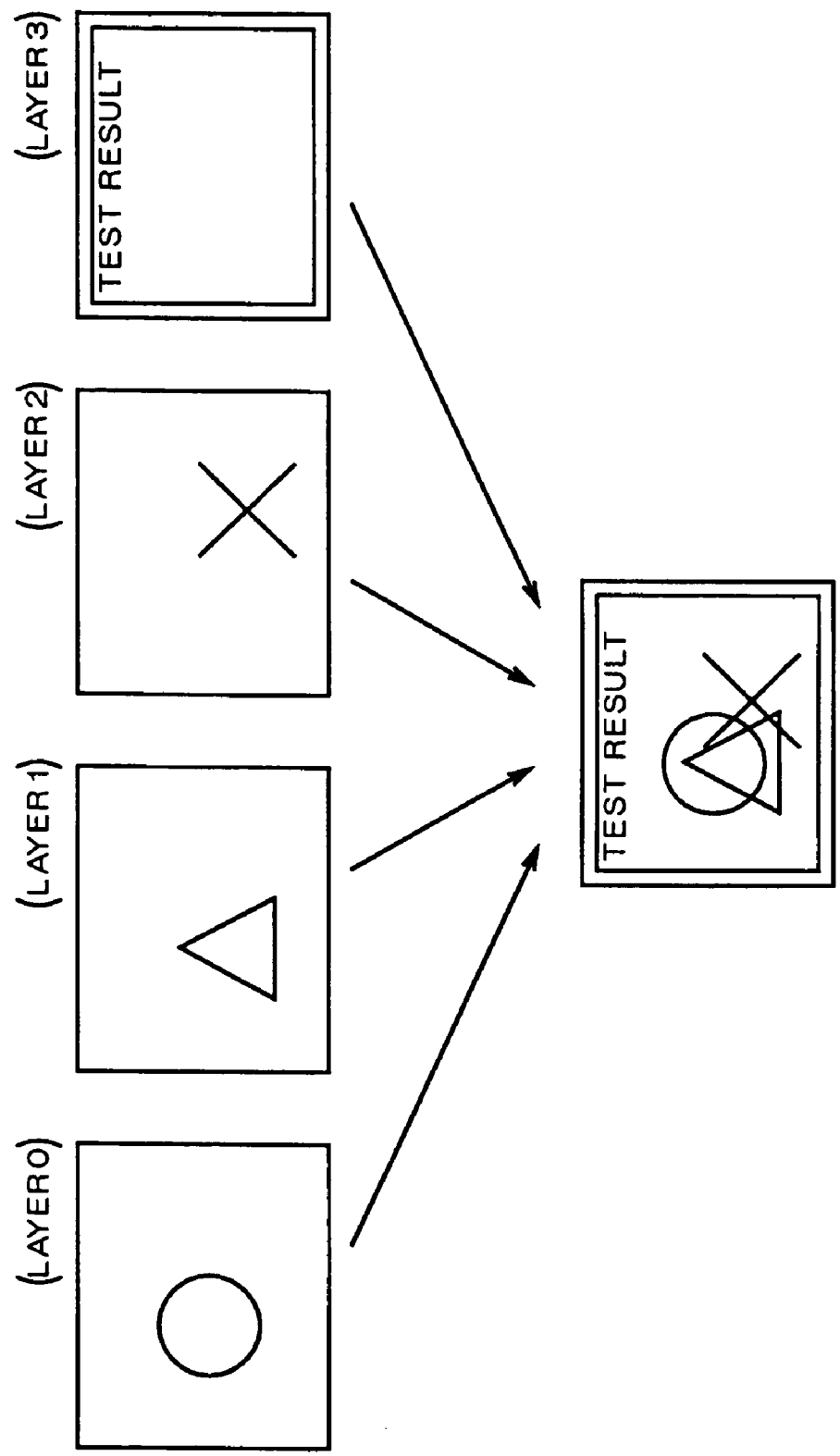
FIG. 20 is a diagram showing another specific example of superimposition of fail bit maps.

FIG. 20 is a diagram showing another specific example of superimposition of fail bit maps. It is assumed that an image unrelated to a test result of a fail bit map or the like is included in any one layers, for example. FIG. 20 shows an outline in the case in which superimposition of the images of the plurality of the layers including the above one layer is performed. As the image not relating to a test result, for example, images such as a predetermined frame, ruled lines, letters, or the like are possible. In the example shown in FIG. 20, an image including a frame and a letters of "test result" is related to the layer 4 to be arranged at the top, and this image and images of the respective fail bit maps are superimposed. Consequently, legibility of displayed contents, or the like can be improved.

In this way, in the fail analysis device of this embodiment, each of the superimposed plurality of fail bit map images corresponds to a plurality of layers, and relationship among the layers is defined using the layer window. Thus, in the case in which zoom processing or move processing is performed, a user can change displayed contents while maintaining a mutual relation of the respective fail bit map images. Consequently, the user does not need to instruct the zoom processing or the move processing individually with respect to the respective fail bit map images, and operations can be simplified significantly.

Further, to turn off or redisplay for each of the superimposed fail bit maps, the user only has to switch the visible display mark c3 and the invisible mark c4 in the layer window. Consequently, it becomes unnecessary to repeat reading of data and drawing processing each time, simplification of processing and operations becomes possible.

Moreover, when relationship among the respective layers is defined using the layer window, since contents of a logical operation can be set, a logical operation targeting each fail bit map becomes possible in accordance with the set contents.

INDUSTRIAL APPLICABILITY

As described above, according to the present invention, test results corresponding to a plurality of semiconductor memories are displayed in one screen. Therefore, it becomes easy to grasp an outline of fail information concerning each semiconductor memory. In addition, trouble some labors, which are required until contents of a detailed fail bit map corresponding to a semiconductor memory including the fail part or an I/O number are confirmed, are reduced, and simplification of operations becomes possible.

Further, according to the present invention, since a range in which a test result is acquired is set as a first range larger than a second range which is a display range, a user does not need to acquire the test result again in changing the display range within the first range. Therefore, time required since change of the display range is instructed until the display range is actually changed can be reduced.

Furthermore, a reduced image and a detailed image are both included in an identical screen. Therefore, the user can designate change of a display range using the reduced image. The user does not need to switch to a detailed display screen after roughly confirming contents on a reduced display screen as in the past, and operability in giving a switching instruction can be improved.

Moreover, since each of a superimposed plurality of fail bit map images is correspondent to a plurality of layers and relationship among the respective layers is defined, in the case in which a user performs change of contents of a display image, the user can change the displayed contents while maintaining a mutual relation among the respective fail bit map images. Consequently, the user does not need to give a move instruction individually or give an instruction to change a display magnification for each fail bit map image, and operations can be simplified significantly.

The invention claimed is:

1. A fail analysis device for displaying results of testing a plurality of semiconductor memories with a semiconductor test device, comprising:
   a test result acquiring unit for acquiring test results corresponding to said plurality of semiconductor memories;
   a list image generation unit for generating a list image in which the test results corresponding to said plurality of semiconductor memories, which are acquired by said test result acquiring unit, are included in one screen; and
   a display unit for displaying said list image generated by said list image generation unit.

2. The fail analysis device according to claim 1, characterized in that a result image indicating pass/fail for each of said plurality of semiconductor memories is included in said list image as said test result.

3. The fail analysis device according to claim 1, characterized in that a reduced image of a fail bit map is included for each of said plurality of semiconductor memories in said list image as said test result.

4. The fail analysis device according to claim 2, further comprising:
   an operation unit for designating any position in said list image displayed on said display unit; and
   a detailed image generation unit for, when any of said result images is designated by said operation unit, generating a detailed image of a fail bit map corresponding to the result image,
   characterized in that said detailed image generated by said detailed image generation unit is displayed by said display unit.

5. The fail analysis device according to claim 3, further comprising:
   an operation unit for designating any position in said list image displayed on said display unit; and
   a detailed image generation unit for, when any of said reduced images is designated by said operation unit, generating a detailed image of a fail bit map corresponding to the reduced image,
   characterized in that said detailed image generated by said detailed image generation unit is displayed by said display unit.

6. The fail analysis device according to claim 3, characterized in that said semiconductor test device generates a reduced fail bit map data necessary for displaying said reduced image, and
   said list image generation unit generates said reduced image based upon said reduced fail bit map data.

7. A fail analysis device for displaying a result of testing a semiconductor memory with a semiconductor test device, wherein said semiconductor memory has plural I/O numbers associated therewith, comprising:
   a test result acquiring unit for acquiring a test result corresponding to said semiconductor memory;
   a list image generation unit for generating a list image in which a test result for each of said plural I/O numbers of said semiconductor memory, which is acquired by said test result acquiring unit, is included in one screen; and
   a display unit for displaying said list image generated by said list image generation unit.

8. The fail analysis device according to claim 7, characterized in that a result image indicating pass/fail for each said I/O number is included in said list image as said test result.

9. The fail analysis device according to claim 8, characterized in that a reduced image of a fail bit map is included for each said I/O number in said list image as said test result.

10. The fail analysis device according to claim 8, further comprising:
    an operation unit for designating any position in said list image displayed on said display unit; and
    a detailed image generation unit for, when any of said result images is designated by said operation unit, generating a detailed image of a fail bit map corresponding to the result image,
    characterized in that said detailed image generated by said detailed image generation unit is displayed by said display unit.

11. The fail analysis device according to claim 9, further comprising:
    an operation unit for designating any position in said list image displayed on said display unit; and
    a detailed image generation unit for, when any of said reduced images is designated by said operation unit, generating a detailed image of a fail bit map corresponding to the reduced image,
    characterized in that said detailed image generated by said detailed image generation unit is displayed by said display unit.

12. The fail analysis device according to claim 9, characterized in that said semiconductor test device generates a reduced fail bit map data necessary for displaying said reduced image, and
    said list image generation unit generates said reduced image based upon said reduced fail bit map data.

13. A fail analysis device for displaying a result of testing a semiconductor memory with a semiconductor test device, comprising:
    a test result acquiring unit for acquiring a test result of said semiconductor memory enabling generation of a fail bit map of a first range;
    a fail bit map generation unit for generating an image of a fail bit map of a second range narrower than said first range using a part of said test result acquired by said test result acquiring unit;
    a display unit for displaying said image generated by said fail bit map generation unit;
    an operation unit for instructing a display range of said fail bit map; and
    a display range changing unit for changing said display range using said test result acquired by said test result acquiring unit when change of said display range is instructed within said first range by said operation unit.

14. The fail analysis device according to claim 13, characterized by comprising an acquisition range setting unit for variably setting a size of said first range according to a size of said display range instructed by said operation unit.

15. A fail analysis device for displaying a result of testing a semiconductor memory with a semiconductor test device, comprising:
    a test result acquiring unit for acquiring a test result of said semiconductor memory enabling generation of a fail bit map of a first range;

a fail bit map generation unit for generating an image of a fail bit map of a second range narrower than said first range using a part of said test result acquired by said test result acquiring unit;

a display unit for displaying said image generated by said fail bit map generation unit;

an operation unit for instructing a display range of said fail bit map; and a display range changing unit for changing said display range using said test result acquired by said test result acquiring unit when change of said display range is instructed within said first range by said operation unit characterized in that said test result acquiring unit performs reacquisition of the test result of said semiconductor memory when change of said display range exceeding said first range is instructed by said operation unit.

16. A fail analysis device for displaying a result of testing a semiconductor memory with a semiconductor test device, comprising:

a test result acquiring unit for acquiring a test result of said semiconductor memory;

a fail bit map generation unit for generating a first image of a fail bit map and a second image of a reduced predetermined range including the vicinity of said first image using said test result acquired by said test result acquiring unit;

a display unit for displaying said first image and said second image in one screen;

an operation unit f or instructing change of a display range of said fail bit map corresponding to said first image using said second image; and a display range changing unit for changing displayed contents of said first image when change of said display range is instructed by said operation unit.

17. The fail analysis device according to claim 16, characterized in that said operation unit is a pointing device capable of designating an arbitrary position on a display screen, and by designating two points in said second image with the pointing device, a rectangular area with these two points as opposite angles is designated as said display range after change.

18. The fail analysis device according to claim 16, characterized in that said operation unit is a pointing device capable of designating an arbitrary position on a display screen, and after designating one point in said second image with the pointing device, move of the display range is instructed by designating a moving direction and a moving amount.

19. The fail analysis device according to claim 16, characterized in that an acquisition frame indicating a range of said test result acquired by said test result acquiring unit and a display frame indicating a drawing range of said first image are included in said second image.

20. A fail analysis device for displaying a result of testing a semiconductor memory with a semiconductor test device, comprising:

a test result acquiring unit for acquiring a test result of said semiconductor memory;

a fail bit map generation unit for generating a first image of a fail bit map and a second image of a reduced predetermined range including the vicinity of said first image using said test result acquired by said test result acquiring unit;

a display unit for displaying said first image and said second image in one screen;

an operation unit for instructing change of a display range of said fail bit map corresponding to said first image using said second image; and a display range changing unit for changing displayed contents of said first image when change of said display range is instructed by said operation unit, characterized in that an acquisition frame indicating a range of said test result acquired by said test result acquiring unit and a display frame indicating a drawing range of said first image are included in said second image, and characterized in that said test result acquiring unit performs reacquisition of said test result of said semiconductor memory when change of said display range exceeding said acquisition frame is instructed by said operation unit.

21. A fail analysis device for displaying a result of testing a semiconductor memory with a semiconductor test device, comprising:

a fail bit map generation unit for generating a plurality of fail bit map images representing a test result corresponding to said semiconductor memory;

a layer control unit for assigning each of said plurality of fail bit map images to a plurality of layers and, at the same time, defining relationship among the respective layers;

an image superimposing unit for performing processing for superimposing said plurality of fail bit map images defined the relationship among said plurality of layers by said layer control unit; and a display unit for displaying the images superimposed by said image superimposing unit.

22. The fail analysis device according to claim 21, characterized in that said layer control unit controls a display/non-display state of a fail bit map image for each said layer.

23. The fail analysis device according to claim 21, characterized in that said layer control unit sets contents of a logical operation targeting each of said plurality of layers according to said relation.

24. The fail analysis device according to claim 21, characterized by further comprising:

an operation unit for instructing change of a display range of said fail bit map; and a display range changing unit for, when change of said display range is instructed by said operation unit, executing change of said display range targeting said plurality of fail bit maps corresponding to said plurality of layers assigned by said layer control unit.

25. The fail analysis device according to claim 21, characterized in that said layer control unit defines said relationship by assigning images including images not relating to said test result other than said plurality of fail bit map images to each of said plurality of layers.

* * * * *